United States Patent
Yuge et al.

(10) Patent No.: US 11,181,245 B2
(45) Date of Patent: Nov. 23, 2021

(54) LIGHT SOURCE DEVICE AND LIGHT PROJECTING DEVICE

(71) Applicant: Panasonic Intellectual Property Management Co., Ltd., Osaka (JP)

(72) Inventors: Ryota Yuge, Toyama (JP); Shigeo Hayashi, Kyoto (JP); Tooru Aoyagi, Toyama (JP); Tetsuya Kamada, Hyogo (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 16/790,594

(22) Filed: Feb. 13, 2020

(65) Prior Publication Data
US 2020/0182424 A1    Jun. 11, 2020

Related U.S. Application Data

(63) Continuation of application No. PCT/JP2018/030348, filed on Aug. 15, 2018.

(30) Foreign Application Priority Data

Sep. 27, 2017  (JP) .............................. JP2017-186045

(51) Int. Cl.
*F21S 41/00*     (2018.01)
*F21S 41/153*    (2018.01)
(Continued)

(52) U.S. Cl.
CPC .......... *F21S 41/153* (2018.01); *F21S 41/125* (2018.01); *F21S 41/143* (2018.01); *F21S 41/25* (2018.01);
(Continued)

(58) Field of Classification Search
CPC ........ F21S 41/153; F21S 41/675; F21S 41/25; F21S 41/365; F21S 41/125; F21S 41/143;
(Continued)

(56) References Cited

U.S. PATENT DOCUMENTS

2014/0071704 A1    3/2014  Yagi
2015/0228630 A1    8/2015  Eichenberg et al.
(Continued)

FOREIGN PATENT DOCUMENTS

JP    2014-056746 A    3/2014
JP    2015-514326 A    5/2015
(Continued)

OTHER PUBLICATIONS

International Search Report issued on International Patent Application No. PCT/JP2018/030348 dated Nov. 20, 2018, with English translation.

*Primary Examiner* — Y M. Quach Lee
(74) *Attorney, Agent, or Firm* — McDermott Will & Emery LLP

(57) ABSTRACT

A light source device includes: a substrate; a light-emitting unit matrix including a plurality of light-emitting units disposed in a matrix on the substrate; and a reflective resin disposed in a region, on the substrate, including a region where the light-emitting unit matrix is disposed. The plurality of light-emitting units include a first light-emitting unit and a second light-emitting unit adjacent to each other in a column direction of the light-emitting unit matrix. The reflective resin includes a first reflective portion disposed between the first light-emitting unit and the second light-emitting unit and extending in a direction intersecting the column direction. At least a portion of an upper surface of
(Continued)

the first reflective portion protrudes beyond an upper surface of the first light-emitting unit and an upper surface of the second light-emitting unit.

9 Claims, 10 Drawing Sheets

(51) Int. Cl.
*F21S 41/675* (2018.01)
*F21S 41/25* (2018.01)
*F21S 41/365* (2018.01)
*F21S 41/125* (2018.01)
*F21S 41/143* (2018.01)
*F21S 41/20* (2018.01)
*F21Y 105/12* (2016.01)
*F21Y 115/10* (2016.01)

(52) U.S. Cl.
CPC .......... *F21S 41/285* (2018.01); *F21S 41/365* (2018.01); *F21S 41/675* (2018.01); *F21Y 2105/12* (2016.08); *F21Y 2115/10* (2016.08)

(58) Field of Classification Search
CPC .. F21S 41/285; F21Y 2105/12; F21Y 2115/10
See application file for complete search history.

(56) References Cited

U.S. PATENT DOCUMENTS

| | | | |
|---|---|---|---|
| 2015/0263065 A1* | 9/2015 | Inoue | H01L 25/0753 257/88 |
| 2016/0252218 A1* | 9/2016 | Fujikawa | F21Y 2105/12 362/241 |
| 2017/0154880 A1* | 6/2017 | Ozeki | H01L 24/97 |
| 2017/0358720 A1* | 12/2017 | Hashimoto | H01L 24/97 |
| 2019/0016252 A1* | 1/2019 | Waragaya | F21S 41/663 362/545 |

FOREIGN PATENT DOCUMENTS

| | | |
|---|---|---|
| JP | 2016-162829 A | 9/2016 |
| JP | 2017-108092 A | 6/2017 |

* cited by examiner

FIG. 9
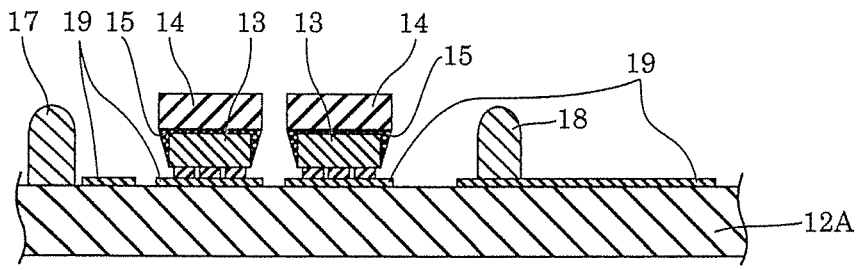
FIG. 10A
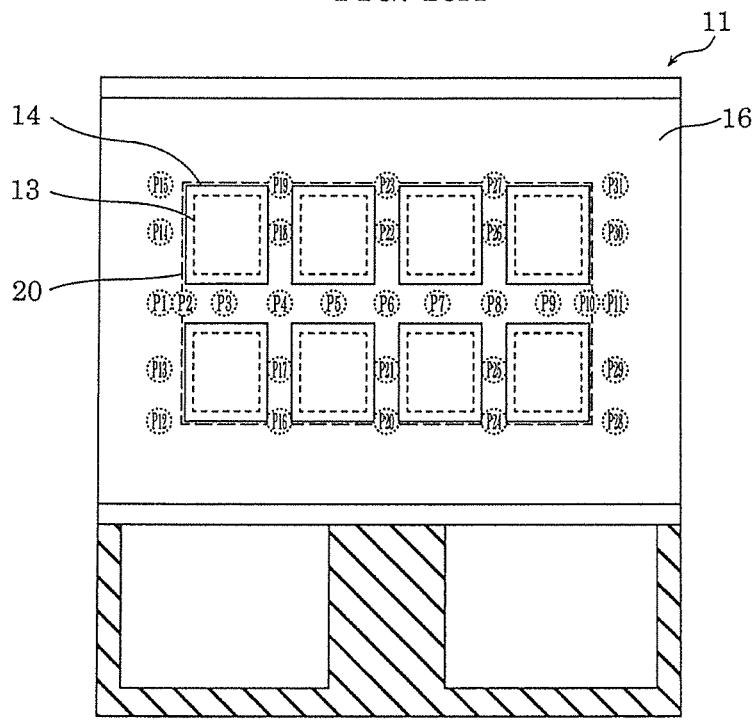
FIG. 10B
| POSITION | PROTRUSION HEIGHT [μm] | POSITION | PROTRUSION HEIGHT [μm] | POSITION | PROTRUSION HEIGHT [μm] | POSITION | PROTRUSION HEIGHT [μm] | POSITION | PROTRUSION HEIGHT [μm] | POSITION | PROTRUSION HEIGHT [μm] |
|---|---|---|---|---|---|---|---|---|---|---|---|
| P1 | −10.2 | P12 | −13.6 | P16 | −0.7 | P20 | −1.1 | P24 | −0.7 | P28 | −15.1 |
| P2 | −3.6 | P13 | −10.7 | P17 | 7.5 | P21 | 9.7 | P25 | 8.8 | P29 | −14.8 |
| P3 | 9.2 | P14 | −11.2 | P18 | 8.4 | P22 | 10 | P26 | 9.5 | P30 | −12.9 |
| P4 | 18.2 | P15 | −12.2 | P19 | −0.1 | P23 | 0.5 | P27 | 0.1 | P31 | −15.4 |
| P5 | 15.3 | | | | | | | | | | |
| P6 | 20.4 | | | | | | | | | | |
| P7 | 16.5 | | | | | | | | | | |
| P8 | 18.1 | | | | | | | | | | |
| P9 | 13.2 | | | | | | | | | | |
| P10 | −2 | | | | | | | | | | |
| P11 | −11.1 | | | | | | | | | | |

LIGHT SOURCE DEVICE AND LIGHT PROJECTING DEVICE

CROSS REFERENCE TO RELATED APPLICATIONS

This application is a U.S. continuation application of PCT International Patent Application Number PCT/JP2018/030348 filed on Aug. 15, 2018, claiming the benefit of priority of Japanese Patent Application Number 2017-186045 filed on Sep. 27, 2017, the entire contents of which are hereby incorporated by reference.

BACKGROUND

1. Technical Field

The present disclosure relates to a light source device and a light projecting device.

2. Description of the Related Art

In recent years, a semiconductor light source device, such as a light-emitting diode or laser diode, has been used as a light source for an automobile headlamp, outdoor and indoor lighting, and the like. In the light distribution pattern of such a light source device, in particular, good contrast between the light-emitting region and the non-light-emitting region, that is, an optical sharp edge, is important.

Japanese Unexamined Patent Application Publication (Translation of PCT Application) No. 2015-514326 (hereinafter, referred to as Patent Literature (PTL) 1) discloses a light-emitting diode module used for an automobile headlamp. The light-emitting diode module disclosed in PTL 1 includes a plurality of rows of light-emitting elements linearly arranged at equal intervals on the upper surface of a substrate. In the light-emitting diode module disclosed in PTL 1, in order to achieve uniform light emission in the entire row, a light transmissive material is filled between the light-emitting elements in the row. In addition, in order to improve the optical sharp edge in each row, the space between adjacent rows is filled with a reflective resin. By adopting such a configuration, it is attempted to realize uniform light emission in each row including a plurality of light-emitting elements, and improved optical sharp edge in each row.

SUMMARY

A matrix beam headlamp of an automobile individually turns on each light-emitting unit of the light source device to project a desired light distribution pattern. In order to project a clear light distribution pattern, an optical sharp edge is required for each light-emitting unit of the light source device. In addition, a light-emitting system has been developed in which a light distribution pattern of a light source device is radiated forward through a mirror array and a lens, such as a digital micromirror device (DMD) method that is an enhanced matrix beam headlamp. In such a light-emitting system, the optical sharp edge of each light-emitting unit is required to be further improved.

In the light-emitting diode module, described in PTL 1, where light-emitting elements are disposed in a matrix, in order to perform uniform light emission in each row, a light transmissive material is disposed between the light-emitting elements in the row. However, optical sharp edge for each light-emitting element is not considered. In addition, although a reflective resin is disposed around the entire light source unit to improve the optical sharp edge, it is far from satisfying the required specifications of matrix beam headlamp applications for an automobile in the future. Further improvement of the optical sharp edge for each light-emitting element needs to be addressed.

An object of the present disclosure is to provide a light source device which includes a plurality of light-emitting units and which is capable of realizing an optical sharp edge for each light-emitting unit, and a light projecting device which includes the light source device.

An aspect of a light source device according to the present disclosure includes: a substrate; a light-emitting unit matrix including a plurality of light-emitting units disposed in a matrix on the substrate; and a reflective resin disposed in a region on the substrate, the region including a region where the light-emitting unit matrix is disposed. The plurality of light-emitting units include a first light-emitting unit and a second light-emitting unit adjacent to each other in a column direction of the light-emitting unit matrix, the reflective resin includes a first reflective portion disposed between the first light-emitting unit and the second light-emitting unit, and extending in a direction intersecting the column direction, and at least a portion of an upper surface of the first reflective portion protrudes beyond an upper surface of the first light-emitting unit and an upper surface of the second light-emitting unit.

With this, among the light emitted from each light-emitting unit, part of the light traveling upward and over the adjacent light-emitting unit is reflected by the protruding reflective resin. For this reason, mixing of the light emitted from adjacent light-emitting units is reduced. Therefore, an optical sharp edge for each light-emitting unit can be realized.

In the aspect of the light source device according to the present disclosure, it may be that the plurality of light-emitting units include a third light-emitting unit and a fourth light-emitting unit adjacent to each other in the column direction, the first light-emitting unit, the second light-emitting unit, the third light-emitting unit, and the fourth light-emitting unit are arranged in a matrix of two rows and two columns, the third light-emitting unit is adjacent to the first light-emitting unit, the fourth light-emitting unit is adjacent to the second light-emitting unit, the reflective resin includes a second reflective portion disposed between the first light-emitting unit and the third light-emitting unit and extending in the column direction, and an upper surface of a first intersection where the first reflective portion intersects the second reflective portion protrudes beyond an upper surface of a portion of the first reflective portion between the first light-emitting unit and the second light-emitting unit and an upper surface of a portion of the second reflective portion between the first light-emitting unit and the third light-emitting unit.

In this manner, by making the first intersection which is a region surrounded by four light-emitting units protrude, the first intersection is locally made high and protrude beyond the upper surface of each light-emitting unit. This allows the light emitted laterally among the light emitted from each light-emitting unit to be reflected upward. Therefore, the optical sharp edge between the light-emitting units can be improved.

In the aspect of the light source device according to the present disclosure, it may be that in a plan view of the substrate, the first light-emitting unit and the second light-emitting unit are arranged adjacent to one of outer edges of the light-emitting unit matrix extending in the column direction of the light-emitting unit matrix, and an upper surface of the first reflective portion approaches the substrate as the first reflective portion approaches the one of the outer edges from the first intersection.

Accordingly, absorption of the light by the reflective resin near the outer edge can be reduced, and the light extraction efficiency of the light source device as a whole can be improved.

In the aspect of the light source device according to the present disclosure, it may be that the plurality of light-emitting units include a fifth light-emitting unit and a sixth light-emitting unit adjacent to each other in the column direction, the first light-emitting unit, the second light-emitting unit, the third light-emitting unit, the fourth light-emitting unit, the fifth light-emitting unit, and the sixth light-emitting unit are arranged in a matrix of two rows and three columns, the fifth light-emitting unit is adjacent to the third light-emitting unit, the sixth light-emitting unit is adjacent to the fourth light-emitting unit, the reflective resin includes a third reflective portion disposed between the third light-emitting unit and the fifth light-emitting unit and extending in the column direction, and the upper surface of the first intersection and an upper surface of a second intersection where the first reflective portion intersects the third reflective portion protrude beyond an upper surface of a portion of the first reflective portion between the first intersection and the second intersection.

In this manner, by making the first intersection and the second intersection each of which is a region surrounded by four light-emitting units protrude, the first intersection and the second intersection are made locally high and protrude beyond the upper surface of each light-emitting unit. This allows the light emitted laterally among the light emitted from each light-emitting unit to be reflected upward. Therefore, the optical sharp edge between the light-emitting units can be improved.

In the aspect of the light source device according to the present disclosure, it may be that in a plan view of the substrate, in an outer edge portion where the first reflective portion intersects an outer edge of the light-emitting unit matrix, the upper surface of the reflective resin is recessed relative to the upper surface of the first light-emitting unit and the upper surface of the second light-emitting unit.

With this, the light emitted toward outside the light-emitting unit matrix is less likely to enter the reflective resin. This reduces absorption of light by the reflective resin, and improves the light extraction efficiency of the light source device as a whole.

In the aspect of the light source device according to the present disclosure, it may be that an upper surface of the reflective resin outside the light-emitting unit matrix is recessed relative to the upper surface of the first light-emitting unit and the upper surface of the second light-emitting unit.

With this, the light emitted toward outside the light-emitting unit matrix is less likely to enter the reflective resin. This reduces absorption of light by the reflective resin and improves the light extraction efficiency of the light source device as a whole.

In the aspect of the light source device according to the present disclosure, it may be that in a plan view of the substrate, a gap between the first light-emitting unit and the second light-emitting unit is less than or equal to 200 μm.

This causes capillary action, making it possible to realize a shape in which the reflective resin between the light-emitting units protrudes beyond the upper surface of each light-emitting unit.

In the aspect of the light source device according to the present disclosure, it may be that the gap is less than or equal to 100 μm.

Accordingly, the shape in which the reflective resin between the light-emitting units protrudes beyond the upper surface of each light-emitting unit can be realized more reliably.

In the aspect of the light source device according to the present disclosure, it may be that each of the first light-emitting unit and the second light-emitting unit includes a light-emitting element bonded to the substrate, and a light transmissive member disposed on a first surface of the light-emitting element opposite a second surface of the light-emitting element, the second surface being adjacent to the substrate.

A light projecting device according to one aspect of the present disclosure includes: the light source device; and a lens group including lenses corresponding to the plurality of light-emitting units.

Since such a light projecting device includes the light source device, the same advantageous effects as the light source device can be obtained.

A light projecting device according to one aspect of the present disclosure includes: the light source device; a mirror array corresponding to the light-emitting unit matrix; a lens which condenses, on the mirror array, light emitted from the light source device; and a light projecting lens which projects a radiation pattern formed by the mirror array.

Since such a light projecting device includes the light source device, the same advantageous effects as the light source device can be obtained.

According to the present disclosure, it is possible to provide a light source device which includes a plurality of light-emitting units and which is capable of realizing an optical sharp edge for each light-emitting unit, and a light projecting device which includes the light source device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 9 is a cross-sectional view of the aggregate substrate, a first dam, a second dam, and the like showing the dam formation process according to the embodiment;

FIG. 10A is a plan view showing measurement points of the height of reflective resin;

FIG. 10B is a table showing the protrusion height of the reflective resin at each measurement position;

DETAILED DESCRIPTION OF THE EMBODIMENT

Figure 1:
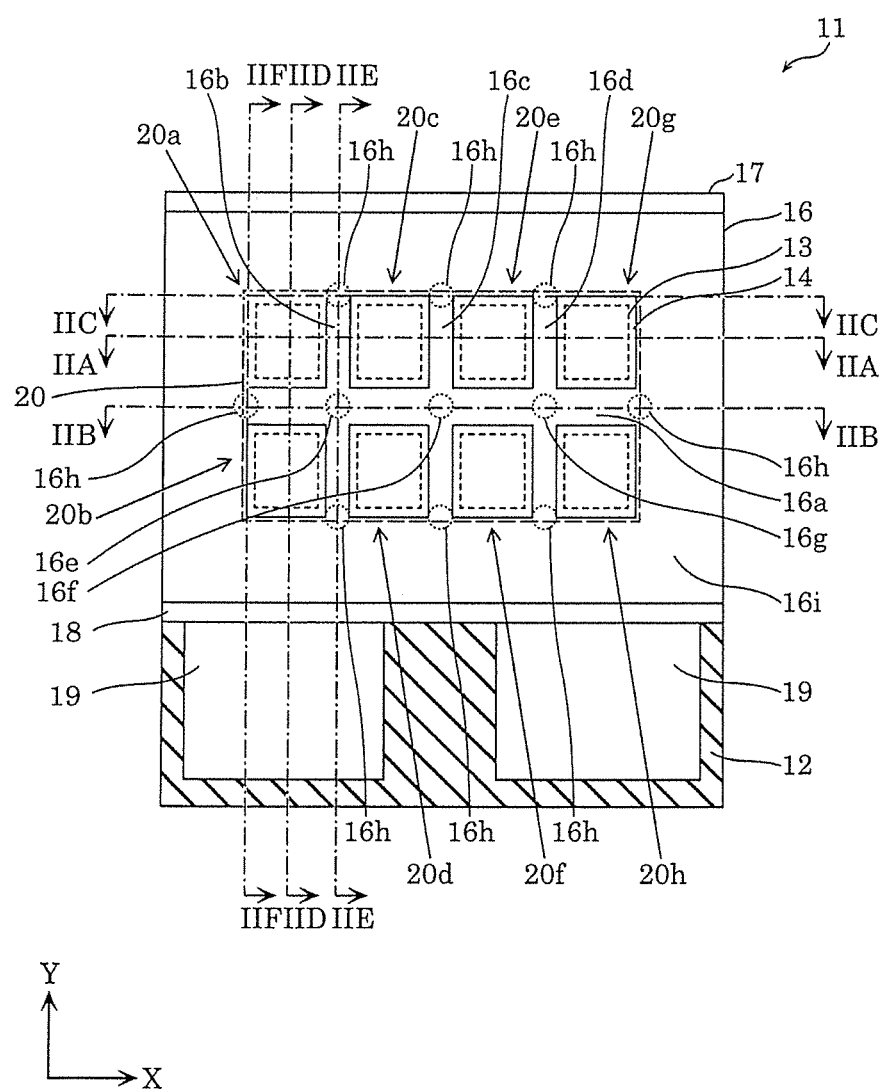
FIG. 1 is a schematic top view of an example of a configuration of a light source device according to an embodiment.

Hereinafter, an embodiment of the present disclosure will be described with reference to the drawings. The embodiment described below shows one specific example of the present disclosure. Accordingly, the numerical values, shapes, materials, structural elements, arrangement positions and connection forms of the structural elements, steps and order of steps, etc. shown in the following embodiment are merely examples, and do not intend to limit the present disclosure. Therefore, among the structural elements in the following embodiment, structural elements that are not described in independent claims indicating the most generic concept of the present disclosure are described as optional structural elements.

Moreover, each drawing is a schematic view, and is not necessarily illustrated exactly. Therefore, the scale and the like do not necessarily match in each figure. In the drawings, substantially the same elements are denoted by the same reference numerals, and overlapping descriptions will be omitted or simplified.

Embodiment

[1. Basic Configuration of Light Source Device]

A basic configuration of a light source device according to an embodiment will be described with reference to FIG. 1 and FIG. 2A.

FIG. 1 is a schematic top view of an example of a configuration of light source device 11 according to the embodiment. FIG. 2A schematically illustrates a cross-section taken along IIA-IIA of light source device 11 in FIG. 1. As illustrated in FIG. 1, light source device 11 includes substrate 12, light-emitting unit matrix 20, and reflective resin 16. In the present embodiment, light source device 11 further includes first dam 17 and second dam 18.

Substrate 12 is a mounting substrate on which light-emitting unit matrix 20 is mounted. Light-emitting unit matrix 20 is a light emitter which includes a plurality of light-emitting units arranged in a matrix on substrate 12. The plurality of light-emitting units include first light-emitting unit 20a and second light-emitting unit 20b adjacent to each other in the column direction (Y-axis direction in FIG. 1) of light-emitting unit matrix 20. In a plan view of substrate 12, first light-emitting unit 20a and second light-emitting unit 20b are disposed adjacent to one of the outer edges of light-emitting unit matrix 20 (outer peripheral line of light-emitting unit matrix 20) extending in the column direction (that is, Y-axis direction in FIG. 1). Here, the description of the outer edge or the outer peripheral line of light-emitting unit matrix 20 means the line connecting the outer periphery of light-emitting unit matrix 20 in a plan view of substrate 12.

The plurality of light-emitting units include third light-emitting unit 20c and fourth light-emitting unit 20d adjacent to each other in the column direction. First light-emitting unit 20a, second light-emitting unit 20b, third light-emitting unit 20c, and fourth light-emitting unit 20d are arranged in a matrix of two rows and two columns. Third light-emitting unit 20c is adjacent to first light-emitting unit 20a, and fourth light-emitting unit 20d is adjacent to second light-emitting unit 20b.

The plurality of light-emitting units further include fifth light-emitting unit 20e and sixth light-emitting unit 20f adjacent to each other in the column direction. First light-emitting unit 20a, second light-emitting unit 20b, third light-emitting unit 20c, fourth light-emitting unit 20d, fifth light-emitting unit 20e, and sixth light-emitting unit 20f are arranged in a matrix of two rows and three columns. Fifth light-emitting unit 20e is adjacent to third light-emitting unit 20c, and sixth light-emitting unit 20f is adjacent to fourth light-emitting unit 20d.

The plurality of light-emitting units further include seventh light-emitting unit 20g and eighth light-emitting unit 20h adjacent to each other in the column direction. First light-emitting unit 20a, second light-emitting unit 20b, third light-emitting unit 20c, fourth light-emitting unit 20d, fifth light-emitting unit 20e, sixth light-emitting unit 20f, seventh light-emitting unit 20g, and eighth light-emitting unit 20h are arranged in a matrix of two rows and four columns. Seventh light-emitting unit 20g is adjacent to fifth light-emitting unit 20e, and eighth light-emitting unit 20h is adjacent to sixth light-emitting unit 20f.

As described above, in the present embodiment, light-emitting unit matrix 20 includes eight light-emitting units (20a to 20h). Each light-emitting unit includes light-emitting element 13 bonded to substrate 12. In the present embodiment, as illustrated in FIG. 2A, each light-emitting unit further includes light transmissive member 14 disposed on a first surface of light-emitting element 13 opposite a second surface of light-emitting element 13 adjacent to substrate 12, and transparent resin 15 for connecting light-emitting element 13 and light transmissive member 14. In the present embodiment, each light-emitting unit includes light transmissive member 14 and transparent resin 15, but does not always have to include them.

Hereinafter, a configuration of light source device 11 will be described more specifically. As illustrated in FIG. 1, in light source device 11, eight light-emitting elements 13 are arranged in a matrix of two rows and four columns on the upper surface of substrate 12. As illustrated in FIG. 1 and FIG. 2A, wiring electrodes 19 for connecting eight light-emitting elements 13 in series or in parallel are disposed on the upper surface of substrate 12. Each light-emitting element 13 includes an element electrode (not illustrated) which is disposed in the orientation such that the element electrode is positioned on the substrate 12 side, and is flip-chip connected to substrate 12 by bumps.

Here, the first surface of light-emitting element 13 opposite the second surface adjacent to substrate 12 (upper surface in FIG. 2A) is a light-emitting surface, and light transmissive member 14 is bonded onto the light-emitting surface via transparent resin 15. Transparent resin 15, which protrudes out from the upper surface of light-emitting element 13 when bonding light-emitting element 13 and light transmissive member 14 to each other, covers the side surfaces of light-emitting element 13, and forms, on each of the side surfaces of light-emitting element 13, a fillet having a shape with a slope spreading in the direction of light transmissive member 14.

Moreover, in the present embodiment, eight light-emitting units arranged in a matrix at predetermined intervals are referred to light-emitting unit matrix 20, and a region on substrate 12 where light-emitting unit matrix 20 is arranged is referred to as a light-emitting unit matrix arrangement region.

First dam 17 and second dam 18 are members disposed on substrate 12 and outside the light-emitting unit matrix arrangement region. First dam 17 is disposed on an end portion of substrate 12 (that is, an end portion of light source device 11) and parallel to the row direction of light-emitting unit matrix 20. First dam 17 has a length substantially the same as the length of one side of substrate 12 along which first dam 17 is disposed. Second dam 18 is disposed across wiring electrodes 19 in a direction parallel to first dam 17. Second dam 18 has a length substantially the same as first dam 17. First dam 17 and second dam 18 are members for preventing the reflective resin filled in the light-emitting unit matrix arrangement region from leaking to the unnecessary region on substrate 12. For example, first dam 17 and second dam 18 are formed of a silicone resin mixed with light reflective particles such as titanium oxide.

Reflective resin 16 is resin disposed in a region, on substrate 12, including the region where light-emitting unit matrix 20 is disposed. In the present embodiment, reflective resin 16 is disposed on substrate 12 and between first dam 17 and second dam 18. Reflective resin 16 reflects light from each light-emitting unit. Reflective resin 16 fills the gap between adjacent light-emitting units and between light-emitting elements 13 and substrate 12. In addition, reflective resin 16 is disposed so as to cover the side surfaces of each light-emitting unit and to expose the upper surface of each light-emitting unit. In the present embodiment, reflective resin 16 is disposed so as to expose the upper surface of light transmissive member 14.

Next, the shape of reflective resin 16 will be described with reference to FIG. 2B to FIG. 2F in addition to FIG. 1 and FIG. 2A.

FIG. 2B, FIG. 2C, FIG. 2D, FIG. 2E, and FIG. 2F schematically illustrate cross-sections take along IIB-IIB, IIC-IIC, IID-IID, IIE-IIE and IIF-IIF of light source device 11 in FIG. 1, respectively.

Between adjacent light-emitting units in light-emitting unit matrix 20, there are a first gap extending in a first direction (row direction of light-emitting unit matrix 20) indicated by the X-axis direction in FIG. 1, and a second gap, a third gap, and a fourth gap extending in a second direction (column direction of light-emitting unit matrix 20) indicated by the Y-axis direction in FIG. 1. All of the gaps are filled with reflective resin 16. The second gap is a gap between first light-emitting unit 20a and second light-emitting unit 20b and third light-emitting unit 20c and fourth light-emitting unit 20d. The third gap is a gap between third light-emitting unit 20c and fourth light-emitting unit 20d and fifth light-emitting unit 20e and sixth light-emitting unit 20f. The fourth gap is a gap between fifth light-emitting unit 20e and sixth light-emitting unit 20f and seventh light-emitting unit 20g and eighth light-emitting unit 20h.

Here, as illustrated in FIG. 1, reflective resin 16 filled in the first gap, the second gap, the third gap, and the fourth gap are respectively referred to as first reflective portion 16a, second reflective portion 16b, third reflective portion 16c, and fourth reflective portion 16d. In other words, first reflective portion 16a is a portion of reflective resin 16 which is disposed between first light-emitting unit 20a and second light-emitting unit 20b and extends in a direction intersecting the column direction of light-emitting unit matrix 20. In the present embodiment, first reflective portion 16a extends in the row direction of light-emitting unit matrix 20 (X-axis direction in FIG. 1). Second reflective portion 16b is a portion of reflective resin 16 which is disposed between first light-emitting unit 20a and third light-emitting unit 20c, and extends in the column direction of light-emitting unit matrix 20 (that is, the Y-axis direction in FIG. 1). Third reflective portion 16c is a portion of reflective resin 16 which is disposed between third light-emitting unit 20c and fifth light-emitting unit 20e and extends in the column direction of light-emitting unit matrix 20. Fourth reflective portion 16d is a portion of reflective resin 16 which is disposed between fifth light-emitting unit 20e and seventh light-emitting unit 20g and extends in the column direction of light-emitting unit matrix 20.

The portions where first reflective portion 16a intersects second reflective portion 16b, third reflective portion 16c, and fourth reflective portion 16d are referred to as first intersection 16e, second intersection 16f, and third intersection 16g, respectively. In a plan view of substrate 12, the portions where the outer edges (that is, the outer peripheral lines) of light-emitting unit matrix 20 intersects first reflective portion 16a, second reflective portion 16b, third reflective portion 16c, and fourth reflective portion 16d are referred to as outer edge portion 16h. In the present embodiment, the outer edges or outer peripheral lines of light-emitting unit matrix 20 are lines indicated by a dashed frame in FIG. 1. A portion of reflective resin 16 which is disposed outside light-emitting unit matrix 20 is referred to as outside portion 16i.

Figure 2A:
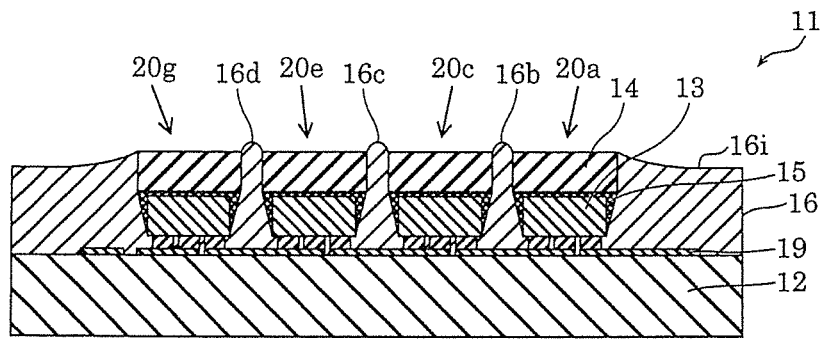
FIG. 2A schematically illustrates a cross-section taken along IIA-IIA of the light source device in FIG. 1.

As illustrated in FIG. 2A, at least a portion of the upper surface of second reflective portion 16b between first light-emitting unit 20a and third light-emitting unit 20c protrudes beyond the upper surface of first light-emitting unit 20a, and the upper surface of third light-emitting unit 20c. In other words, the upper surface of reflective resin 16 in the second gap between the light-emitting units protrudes beyond the upper surface of each light-emitting unit.

In a similar manner, at least a portion of the upper surface of third reflective portion 16c between third light-emitting unit 20c and fifth light-emitting unit 20e protrudes beyond the upper surface of third light-emitting unit 20c and the upper surface of fifth light-emitting unit 20e. Moreover, at least a portion of the upper surface of fourth reflective portion 16d between fifth light-emitting unit 20e and seventh light-emitting unit 20g protrudes beyond the upper surface of fifth light-emitting unit 20e and the upper surface of seventh light-emitting unit 20g.

Here, the "upper surface" of each light-emitting unit or the like means the surface of the light-emitting unit on the side furthest from substrate 12. Moreover, "protrude" means a state of being raised in a direction away from substrate 12 (upward in FIG. 2A).

Figure 2B:
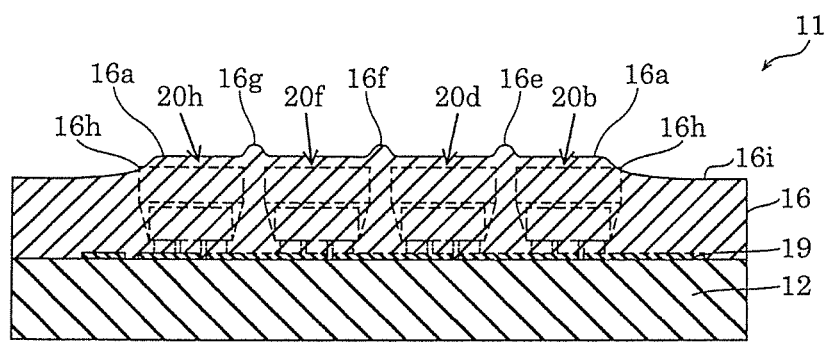
FIG. 2B schematically illustrates a cross-section taken along IIB-IIB of the light source device in FIG. 1.
Figure 2C:
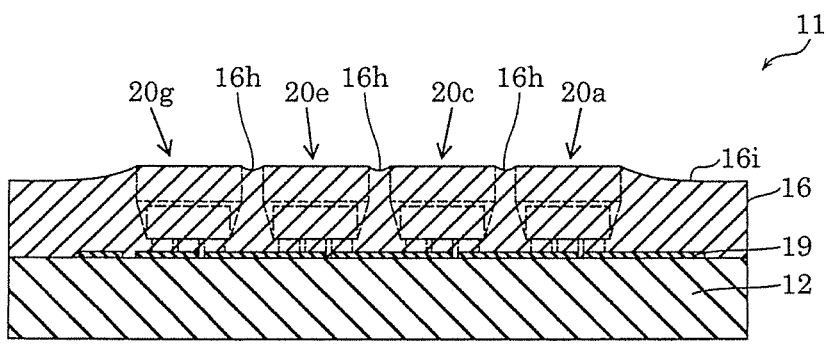
FIG. 2C schematically illustrates a cross-section taken along IIC-IIC of the light source device in FIG. 1.
Figure 2D:
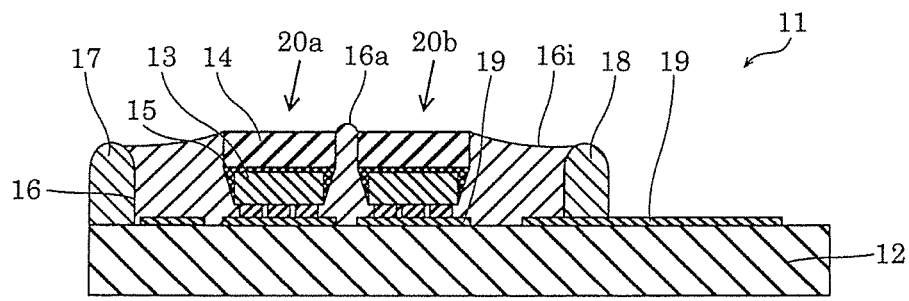
FIG. 2D schematically illustrates a cross-section taken along IID-IID of the light source device in FIG. 1.

As illustrated in FIG. 2D, at least a portion of the upper surface of first reflective portion 16a between first light-emitting unit 20a and second light-emitting unit 20b protrudes beyond the upper surface of first light-emitting unit 20a, and the upper surface of second light-emitting unit 20b. In other words, the upper surface of reflective resin 16 in the first gap between the light-emitting units protrudes beyond the upper surface of each light-emitting unit.

As described above, since reflective resin 16 protrudes beyond the upper surface of each light-emitting unit, part of the light traveling upward and over an adjacent light-emitting unit, among the light emitted from each light-emitting unit, is reflected by protruding reflective resin 16. For this reason, mixing of the light emitted from adjacent light-emitting units is reduced. Therefore, an optical sharp edge for each light-emitting unit can be improved.

FIG. 2B illustrates, for example, a cross section of first reflective portion 16a. In FIG. 2B, each light-emitting unit is indicated by a dotted line in order to indicate the positional relationship between each light-emitting unit and reflective resin 16 and the like. As illustrated in FIG. 2B, first reflective portion 16a of reflective resin 16 protrudes beyond the upper surface of each light-emitting unit in almost the entire region inside the light-emitting unit matrix 20. In particular, the protruding amount of first reflective portion 16a at first intersection portion 16e, second intersection portion 16f, and third intersection portion 16g which respectively intersect second reflective portion 16b, third reflective portion 16c, and fourth reflective portion 16d is greater than the surrounding portions. In a plan view of substrate 12, the upper surface of outer edge portion 16h where first reflective portion 16a intersects the outer edge of light-emitting unit matrix 20 is recessed relative to the upper surface of each light-emitting unit.

Figure 2E:
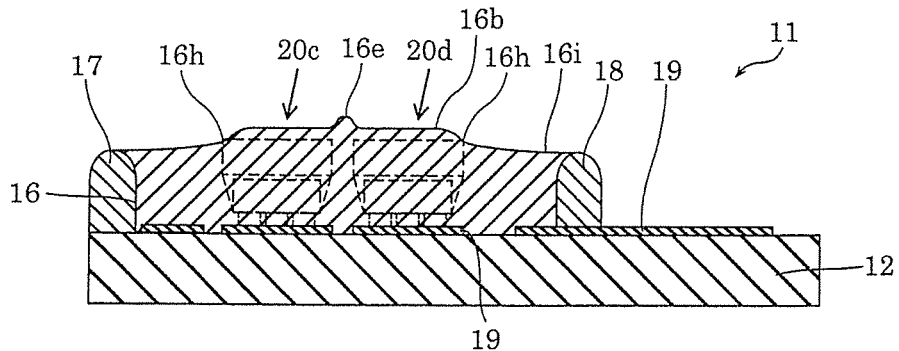
FIG. 2E schematically illustrates a cross-section taken along IIE-IIE of the light source device in FIG. 1.

FIG. 2E illustrates a cross-section of second reflective portion 16b and the like. In FIG. 2E, each light-emitting unit is indicated by a dotted line in order to indicate the positional relationship between each light-emitting unit and reflective resin 16 and the like. Second reflective portion 16b of reflective resin 16 protrudes beyond the upper surface of each light-emitting unit in almost the entire region inside light-emitting unit matrix 20. In particular, the protruding amount of reflective portion 16b at first intersection 16e where first reflective portion 16a intersects second reflective portion 16b is greater than the surrounding portions. Moreover, the upper surface of outer edge portion 16h where second reflective portion 16b intersects the outer edge of light-emitting unit matrix 20 is recessed relative to the upper surface of each light-emitting unit.

As illustrated in FIG. 2B and FIG. 2E, the upper surface of first intersection 16e where first reflective portion 16a intersects second reflective portion 16b protrudes beyond the upper surface of the portion of first reflective portion 16a between first light-emitting unit 20a and second light-emitting unit 20b, and the upper surface of the portion of second reflective portion 16b between first light-emitting unit 20a and third light-emitting unit 20c.

Since light-emitting units are disposed in four directions relative to first intersection 16e where first reflective portion 16a intersects second reflective portion 16b, the luminance is higher in light-emitting unit matrix 20, which greatly affects the light distribution characteristics of adjacent light-emitting units. In this manner, by making first intersection 16e, which is a region surrounded by four light-emitting units, protrude, first intersection 16e is made locally high and protrude beyond the upper surface of each light-emitting unit. This allows the light emitted laterally among the light emitted from each light-emitting unit to be reflected upward. Therefore, the optical sharp edge between the light-emitting units can be improved. In a similar manner to first intersection 16e, the above matter also applies to second intersection 16f and third intersection 16g.

As illustrated in FIG. 2B, among first reflective portion 16a, the protrusion height between first intersection 16e and second intersection 16f, and the protrusion height between second intersection 16f and third intersection 16g are less than the protrusion height at first intersection 16e, second intersection 16f, and third intersection 16g. In other words, among first reflective portion 16a, the protrusion height at the portion sandwiched by two light-emitting units in the column direction of light-emitting unit matrix 20 is less than the protrusion height at each intersection.

As illustrated in FIG. 2B and FIG. 2E, the protrusion height of first reflective portion 16a decreases, as first reflective portion 16a approaches, from first intersection 16e, one of the outer edges (outer edge adjacent to first light-emitting unit 20a and second light-emitting unit 20b) of light-emitting unit matrix 20 extending in the column direction of light-emitting unit matrix 20. The protrusion height of first reflective portion 16a approaches the height of first light-emitting unit 20a and the height of second light-emitting unit 20b which sandwich first reflective portion 16a. In other words, the upper surface of first reflective portion 16a approaches substrate 12, as first reflective portion 16a approaches the one of the outer edges from first intersection 16e. Accordingly, absorption of the light by the reflective resin near the outer edge can be reduced, and the light extraction efficiency of light source device 11 as a whole can be improved.

Moreover, as illustrated in FIG. 2B, the amount of decrease in height of first reflective portion 16a in the region from first intersection 16e to outer edge portion 16h closest to first intersection 16e is greater than the amount of decrease in height of first reflective portion 16a at other portions. In a similar manner, the amount of decrease in height of first reflective portion 16a in the region from third intersection 16g to outer edge portion 16h closest to third intersection 16g is greater than the amount of decrease in height of first reflective portion 16a at other portions.

FIG. 2C schematically illustrates a cross-section taken along the outer edge (outer peripheral line in the first direction) extending in the row direction of light-emitting unit matrix 20 illustrated in FIG. 1. In FIG. 2C, each light-emitting unit is indicated by a dotted line in order to indicate the positional relationship between each light-emitting unit and reflective resin 16. The upper surface of outside portion 16*i* of reflective resin 16 disposed outside light-emitting unit matrix 20 is recessed lower than the upper surface of any light-emitting unit in light-emitting unit matrix 20. In the present embodiment, the upper surface of reflective resin 16 outside light-emitting unit matrix 20 is recessed relative to the upper surface of first light-emitting unit 20*a* and the upper surface of seventh light-emitting unit 20*g*. However, in the vicinity of the side surfaces of first light-emitting unit 20*a* and seventh light-emitting unit 20*g*, reflective resin 16 outside light-emitting unit matrix 20 is lifted to the upper end portions (that is, the end portions on the upper surface side) of the side surfaces of first light-emitting unit 20*a* and seventh light-emitting unit 20*g* by surface tension, making the height equal to the height of the upper surface of each light-emitting unit. The upper surface of outer edge portion 16*h* of reflective resin 16 is recessed relative to the upper surface of each light-emitting unit at the position near the center between the light-emitting units, that is, at the intersection between the center of the second gap in the row direction and the outer edge of light-emitting unit matrix 20.

Figure 2F:
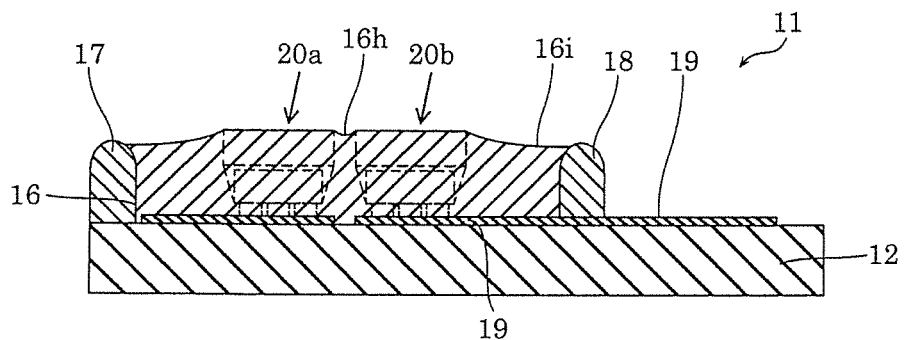
FIG. 2F schematically illustrates a cross-section taken along IIF-IIF of the light source device in FIG. 1.

FIG. 2F schematically illustrates a cross-section taken along the outer edge (outer peripheral line in the second direction) extending in the column direction of light-emitting unit matrix 20 illustrated in FIG. 1. In FIG. 2F, each light-emitting unit is indicated by a dotted line in order to indicate the positional relationship between each light-emitting unit and reflective resin 16. The upper surface of outside portion 16*i* of reflective resin 16 disposed outside light-emitting unit matrix 20 is recessed lower relative to the upper surface of any light-emitting unit in light-emitting unit matrix 20. In the present embodiment, the upper surface of reflective resin 16 outside light-emitting unit matrix 20 is recessed relative to the upper surface of first light-emitting, unit 20*a* and the upper surface of second light-emitting unit 20*b*. However, in the vicinity of the side surfaces of first light-emitting unit 20*a* and second light-emitting unit 20*b*, reflective resin 16 outside light-emitting unit matrix 20 is lifted to the upper end portions of the side surfaces of first light-emitting unit 20*a* and second light-emitting unit 20*b* by surface tension, making the height equal to the height of the upper surface of each light-emitting unit. The upper surface of outer edge portion 16*h* of reflective resin 16 is recessed relative to the upper surface of each light-emitting unit at the position near the center between the light-emitting units, that is, at the intersection between the center of the first gap in the column direction and the outer edge of light-emitting unit matrix 20.

Here, when the upper surface of reflective resin 16 in the region outside light-emitting unit matrix 20 protrudes beyond the upper surface of each light-emitting unit, among the light emitted from the upper surface of each light-emitting unit toward the outside light-emitting unit matrix 20, the light entering the protruding portion of reflective resin 16 is partially absorbed, which results in a reduced efficiency of light source device 11. However, as in the present embodiment, by making the upper surface of reflective resin 16 in the region outside light-emitting unit matrix 20 be recessed relative to the upper surface of each light-emitting unit, the light emitted toward outside light-emitting unit matrix 20 is less likely to enter reflective resin 16. This leads to a reduction in absorption of light by reflective resin 16, and an increased light extraction efficiency of light source device 11 as a whole.

As illustrated in FIG. 2C and FIG. 2F, among first reflective portion 16*a* and second reflective portion 16*b*, the upper surface of outer edge portion 16*h* which is a portion on the outer edge of light-emitting unit matrix 20 is recessed relative to the upper surface of each light-emitting unit. Among the light emitted from the light-emitting units disposed adjacent to the outer edge of light-emitting unit matrix 20, the components directed to the outside light-emitting unit matrix 20 have little influence on the formation of the optical sharp edge between the light-emitting units. Therefore, the components do not have to be reflected by reflective resin 16 toward the light-emitting unit side. Moreover, as described above, the upper surface of outside portion 16*i* of reflective resin 16 and the upper surface of outer edge portion 16*h* of reflective resin 16 are recessed relative to the upper surface of each light-emitting unit. This can reduce the reflection of the components by reflective resin 16, leading to an improved light extraction efficiency of light source device 11.

[2. Configuration of Each Structural Element]

Hereinafter, each structural element of light source device 11 according to the present embodiment will be described.

Substrate 12 is an insulating substrate such as an AlN substrate. Wiring electrodes 19 are disposed on a surface of substrate 12.

Wiring electrode 19 is a film-like conductive member formed of gold plating, for example. Wring electrode 19 may be disposed on the rear surface of substrate 12 (that is, the surface of substrate 12 positioned on the rear side of the mounting surface of substrate 12 on which the light-emitting unit is mounted) by providing a through-hole via in substrate 12.

Figure 3:
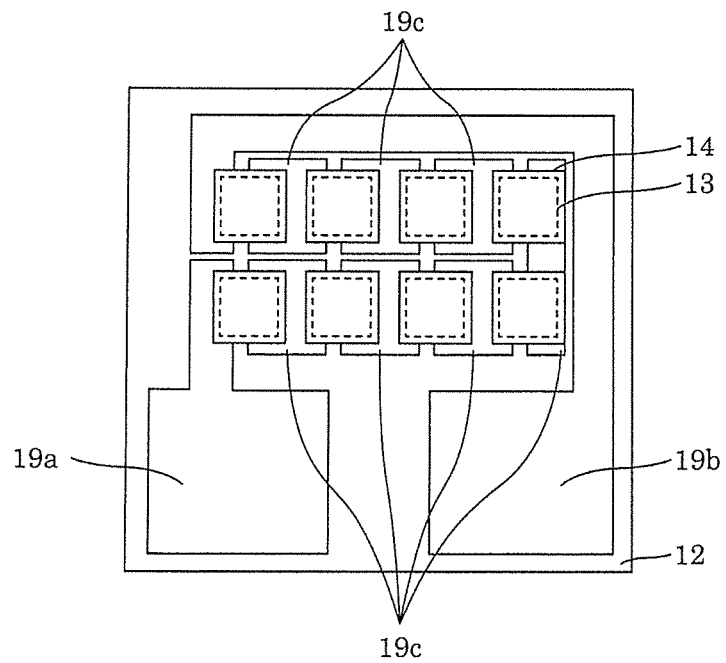
FIG. 3 is a plan view of a substrate showing a schematic configuration of wiring electrodes according to the embodiment.

A configuration of wiring electrode 19 according to the present embodiment will be described with reference to the drawings. FIG. 3 is a plan view of substrate 12 illustrating a schematic configuration of wiring electrode 19 according to the present embodiment. In the present embodiment, wiring electrode 19 is an electrode for connecting eight light-emitting elements 13 in series. Wiring electrode 19 includes extraction electrodes 19*a* and 19*b* for extracting anodes and cathodes of light-emitting elements 13, and seven intermediate electrodes 19*c* for connecting the anodes and the cathodes of eight light-emitting elements 13. In practice, wiring electrode 19 has a complicated shape corresponding to the element electrode pattern of light-emitting elements 13, but it is simplified in FIG. 3.

Each of light-emitting elements 13 includes a growth substrate such as a sapphire substrate or a GaN substrate, and an n-type semiconductor layer, an active layer, and a p-type semiconductor layer (semiconductor multilayer structure) sequentially formed on the growth substrate. Light-emitting element 13 further includes an n-electrode connected to the n-type semiconductor layer and a p-electrode connected to the p-type semiconductor layer. The multilayer structure of light-emitting element 13 is not illustrated in the drawings. The growth substrate is responsible for holding the semiconductor layer. In light-emitting element 13, light generated in the active layer (not illustrated) is emitted to the light transmissive member 14 side through the growth substrate. In other words, the semiconductor layer side of light-emitting element 13 on which electrodes are disposed (substrate 12 side in FIG. 2A) is the mounting surface, and the growth substrate side of light-emitting element 13 (light transmissive member 14 side in FIG. 2A) is the light-emitting surface. SiC, AlGaN, AlN or the like may be used as the material of the growth substrate, in addition to insulating sapphire and GaN.

Light transmissive member 14 is a plate-like wavelength conversion member in which a wavelength conversion material (phosphor) for converting the wavelength of light from light-emitting element 13 is dispersed in a material such as resin, ceramic, or glass. The wavelength conversion material is, for example, a known wavelength conversion material such as YAG, CASN, SiAlON, or LSN. In light transmissive member 14, the surface on the light-emitting element 13 side is the bonding surface with light-emitting element 13, and the surface on the opposite side is the light-emitting surface of light source device 11. In the present embodiment, this light-emitting surface is the upper surface of the light-emitting unit.

In the present embodiment, the size of the surface of light transmissive member 14 to be bonded to light-emitting element 13 is greater than the size of the light-emitting surface of light-emitting element 13, but may be the same.

Transparent resin 15 is disposed between light-emitting element 13 and light transmissive member 14, and has a function of bonding light-emitting element 13 and light transmissive member 14. Transparent resin 15 also has a function as a light guiding member for guiding the light emitted from the side surfaces of light-emitting element 13 to light transmissive member 14 by forming a fillet on each of the side surfaces of light-emitting element 13. As transparent resin 15, resin transparent to light emitted from light-emitting element 13, such as silicone resin, can be used.

Reflective resin 16 is made of, for example, a silicone resin mixed with light reflective particles such as titanium oxide. Reflective resin 16 covers the side surfaces of light-emitting element 13, transparent resin 15 and light transmissive member 14, and has a function of reflecting the light from light-emitting element 13 to the light emitting surface of light transmissive member 14. Reflective resin 16 is also disposed between substrate 12 and light-emitting element 13 as an underfill.

First dam 17 and second dam 18 are disposed at both ends of reflective resin 16. First dam 17 is disposed at an end portion of light source device 11, and second dam 18 is disposed across wiring electrode 19 in a direction parallel to first dam 17. As will be described later, when first dam 17 and second dam 18 are disposed such that when a reflective resin forming material which is a material of reflective resin 16 is filled around the light-emitting units, the reflective resin forming material is filled only in a necessary region on substrate 12. In other words, first dam 17 and second dam 18 are disposed so as to surround the light-emitting units so that the reflective resin forming material does not spread to unnecessary regions. In other words, first dam 17 and second dam 18 are disposed at opposite positions across light-emitting unit matrix 20 via reflective resin 16.

Dams do not have to be used in the case where reflective resin 16 is filled on the entire surface of substrate 12 such as a case where wiring electrode 19 is disposed on the rear surface side of substrate 12 (the side where the light-emitting units are not mounted) by providing through-hole vias in substrate 12.

In the following description, first dam 17 and second dam 18 are collectively referred to as a "dam" when it is not particularly necessary to distinguish between first dam 17 and second dam 18.

[3. Manufacturing Method]

Next, an example of a method for manufacturing light source device 11 according to the present embodiment will be described with reference to the drawings.

[3-1. Substrate Preparation to Light-Emitting Element Mounting Process]

Figure 4A:
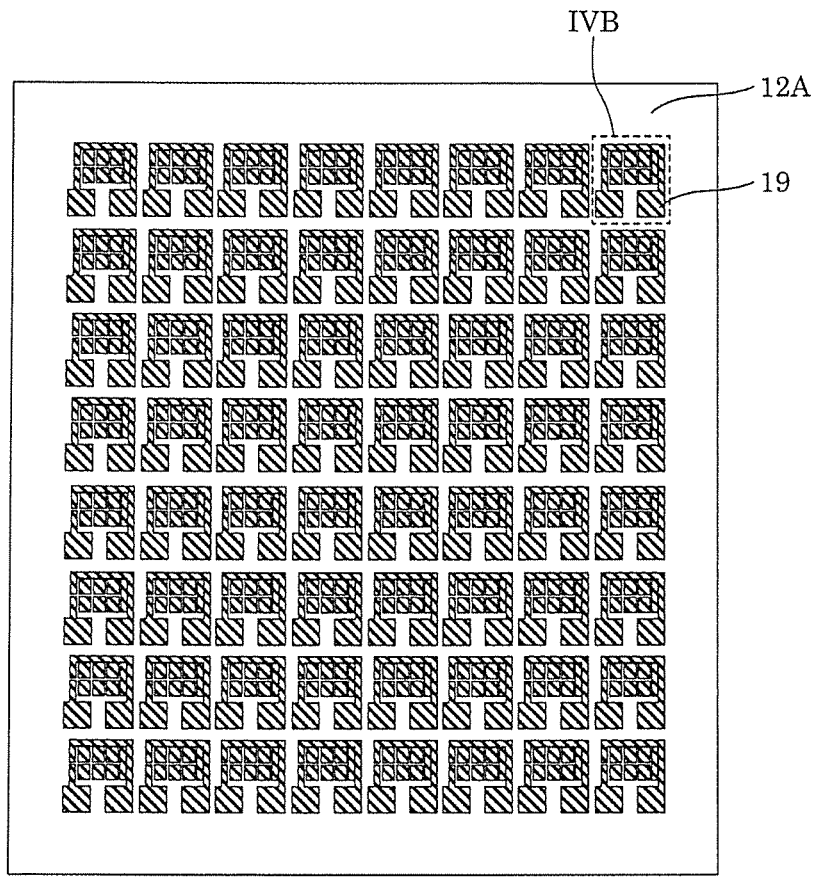
FIG. 4A is a plan view of wiring electrodes disposed on an aggregate substrate which is a base material of the substrate of the light source device according to the embodiment.
Figure 4B:
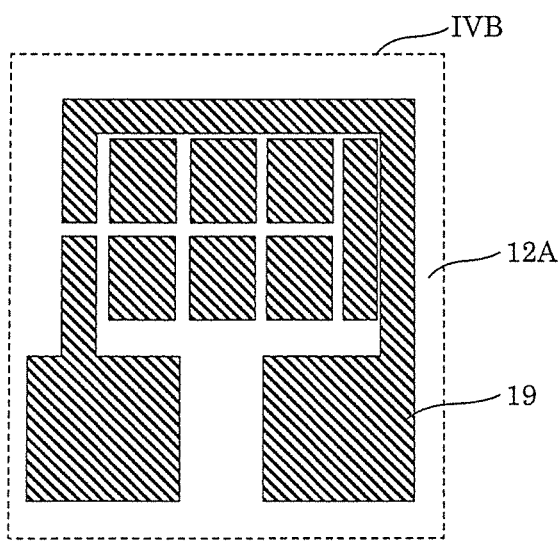
FIG. 4B is an enlarged view of the wiring electrode disposed on the aggregate substrate according to the embodiment.

FIG. 4A is a plan view of wiring electrodes 19 disposed on aggregate substrate 12A which is a base material of substrate 12 of light source device 11 according to the present embodiment. FIG. 4B is an enlarged view of wiring electrode 19 disposed on aggregate substrate 12A. FIG. 4B is an enlarged view of a region within dashed line frame IVB of FIG. 4A.

As illustrated in FIG. 4A and FIG. 4B, first, aggregate substrate 12A (submount), which is before being cut into individual pieces and on which wiring electrodes 19 are formed, is prepared.

Although simplified in FIG. 4A and FIG. 4B, aggregate substrate 12A is a base material on which wiring electrodes 19 for sixty-four light source devices 11 (8 rows and 8 columns) are formed, and is later cut into substrates 12 corresponding to individual light source devices 11 by dicing.

In the present embodiment, a fired AlN substrate is used as aggregate substrate 12A. A conductive pattern including a matrix pattern is formed on aggregate substrate 12A by plating for each of the regions corresponding to individual light source devices 11. This conductive pattern will become wiring electrode 19 in a later process. A metal pad for connecting light-emitting elements 13 is formed on the conductive pattern.

In the present embodiment, as illustrated in FIG. 3, wiring electrode 19 is arranged such that a plurality of light-emitting elements 13 disposed on substrate 12 can be connected in series. Note that the connection configuration of light-emitting elements 13 is not limited to series connection, and a conductive pattern may be appropriately formed to allow desired connection such as parallel connection.

[3-2. Light-Emitting Element Mounting Process]

Figure 5A:
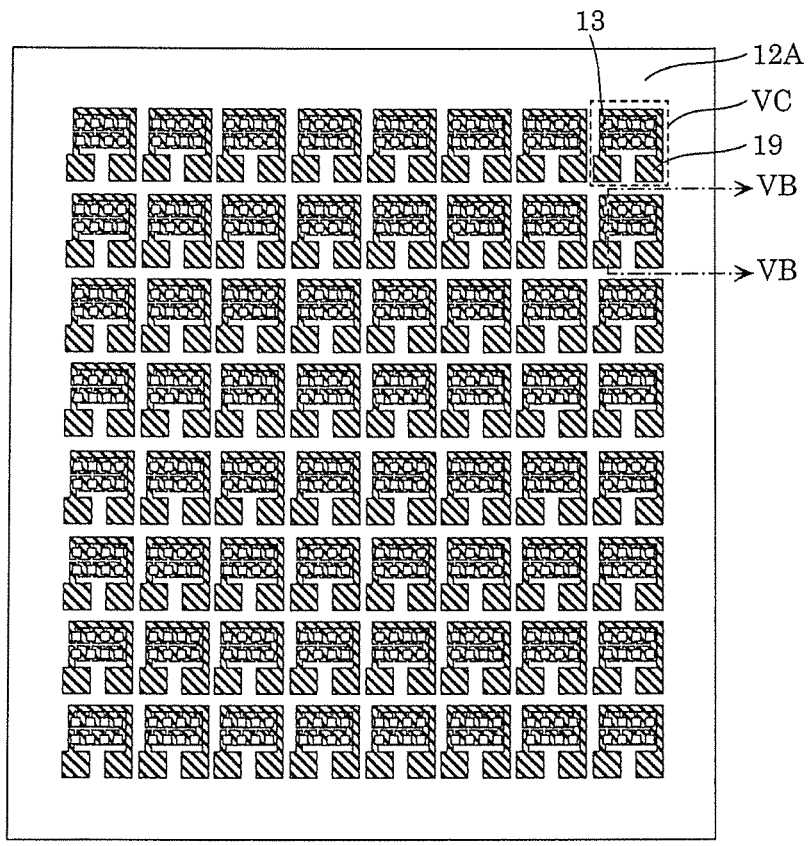
FIG. 5A is a plan view of light-emitting elements mounted on the aggregate substrate according to the embodiment.
Figure 5B:
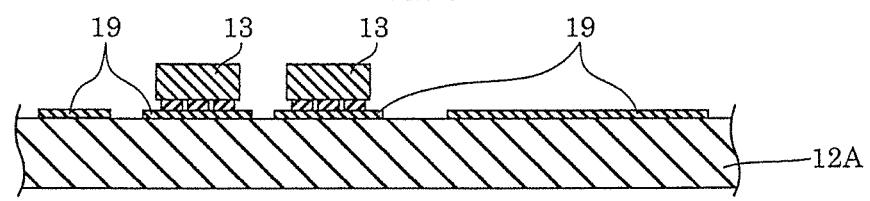
FIG. 5B is a cross-sectional view of the aggregate substrate and the light-emitting elements according to the embodiment.
Figure 5C:
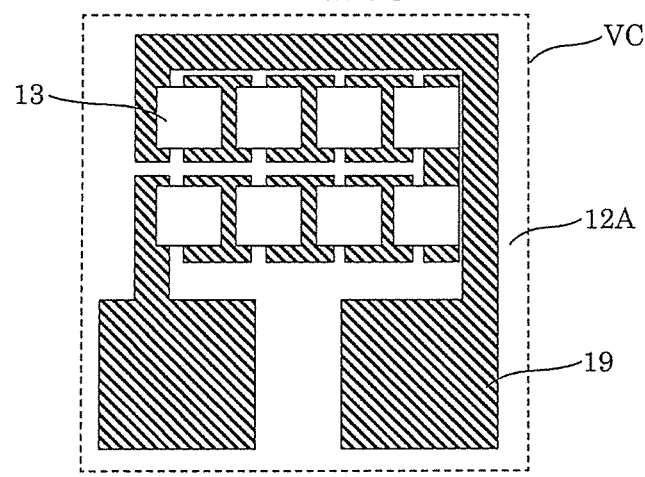
FIG. 5C is an enlarged view of the light-emitting elements disposed on the aggregate substrate according to the embodiment.

Next, a process of mounting light-emitting elements 13 on substrate 12 will be described with reference to the drawings. FIG. 5A is a plan view of light-emitting elements 13 mounted on aggregate substrate 12A according to the present embodiment. FIG. 5B is a cross-sectional view of aggregate substrate 12A and light-emitting elements 13 according to the present embodiment. FIG. 5B illustrates a cross section taken along line VB-VB in FIG. 5A. FIG. 5C is an enlarged view of light-emitting elements 13 disposed on aggregate substrate 12A. FIG. 5C is an enlarged view of a region within dashed line frame VC in FIG. 5A.

In the present embodiment, as illustrated in FIG. 5A and FIG. 5C, eight light-emitting elements 13 are mounted on one light source device 11. At this time, eight light-emitting elements 13 are arranged in a matrix of two rows and four columns. The distance between adjacent light-emitting elements 13 is set to 150 μm in the row direction and 100 μm in the column direction so that the distance between adjacent light-emitting units 13 is 100 μm in the row direction and 50 μm in the column direction at the time of completion of light source device 11.

As light-emitting elements 13 to be mounted, blue LED chips, each having a GaN substrate, and a nitride compound semiconductor formed on the GaN substrate, and having a dimension of a square with sides of 800 μm and a thickness of 100 μm, are used.

In bonding light-emitting element 13 and the metal pad of wiring electrode 19, first, a plurality of metal bumps are mounted on the metal pad. Subsequently, the element electrode of light-emitting element 13 and wiring electrode 19 of substrate 12 are ultrasonically welded using the metal bumps. As illustrated in FIG. 5B, each light-emitting element 13 is arrange in such an orientation that the semiconductor multi-layer structure side of light-emitting element 13 opposes aggregate substrate 12A, and is bonded with aggregate substrate 12A by a flip chip method.

Note that the growth substrate of light-emitting element 13 may have a microtextured structure by having a roughened rear surface (the top surface of mounted light-emitting element 13). In order to roughen the rear surface of the growth substrate, minute irregularities are formed by etching, blasting, processing using a laser or a dicing blade, or the like. When a growth substrate having a refractive index lower than GaN, such as a sapphire substrate, is used as the growth substrate of light-emitting element 13, the rear surface of the growth substrate may be flat.

[3-3. Light Transmissive Member Bonding Process]

Figure 6:
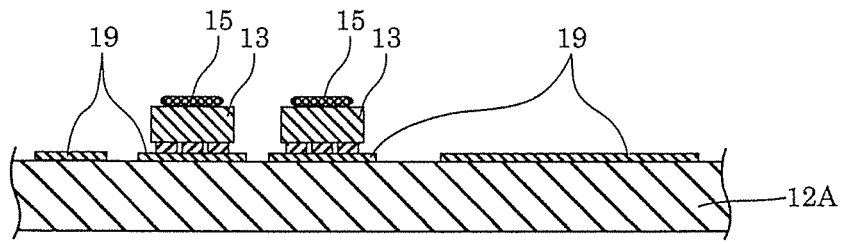
FIG. 6 is a cross-sectional view of the aggregate substrate and the light-emitting elements showing a process for applying a transparent resin to the light-emitting elements.
Figure 7:
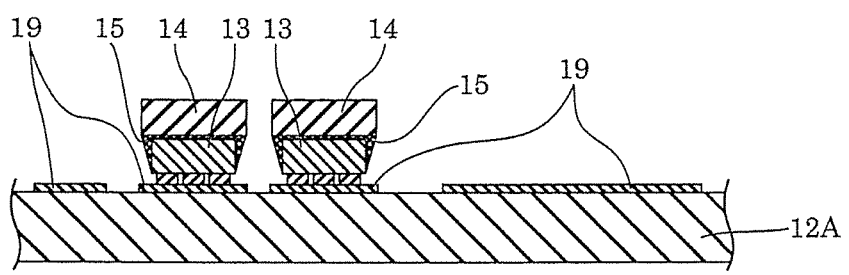
FIG. 7 is a cross-sectional view of the aggregate substrate, the light-emitting elements, and the light transmissive member showing a process for bonding the light transmissive member to the light-emitting elements.

Next, a process for bonding light transmissive member 14 and light-emitting element 13 will be described with reference to the drawings. FIG. 6 is a cross-sectional view of aggregate substrate 12A and light-emitting elements 13 showing a process for applying transparent resin 15 to light-emitting elements 13. FIG. 7 is a cross-sectional view of aggregate substrate 12A, light-emitting elements 13, and light transmissive members 14 showing a process for bonding light transmissive members 14 to light-emitting elements 13. FIG. 6 and FIG. 7 each illustrate a cross section which is similar to the cross section illustrated in FIG. 5B.

As illustrated in FIG. 6, first, a predetermined amount of transparent resin 15 as an adhesive is applied by a dispenser to the center of the rear surface of the growth substrate of each light-emitting element 13. Subsequently, as illustrated in FIG. 7, light transmissive member 14 having a square with sides of 850 μm and a thickness of 100 μm is applied on transparent resin 15. At this time, one plate-like light transmissive member 14 is disposed for one light-emitting element 13. Subsequently, the upper surface of each light transmissive member 14 is pressed toward light-emitting element 13. By this pressing, transparent resin 15 spreads so as to cover the entire upper surface of light-emitting element 13. Light transmissive members 14 are arranged such that the gap between adjacent light transmissive members 14, that is, the gap between the light-emitting units is 100 μm in the row direction and 50 μm in the column direction. Subsequently, aggregate substrate 12A, on which light transmissive members 14 and the like have been disposed, is heated in an oven at 150 degrees Celsius for three hours. In this manner, by curing transparent resin 15, light-emitting elements 13 and light transmissive members 14 are bonded to each other.

In the present embodiment, a silicone resin is used as transparent resin 15. A ceramic containing a phosphor is used as light transmissive member 14. Light transmissive member 14 does not always have to include the phosphor. In addition, as light transmissive member 14, a glass plate, a resin plate or the like may be used instead of the ceramic.

In addition, although the dispensing method was used for application of transparent resin 15, an arbitrary method other than the dispensing method, such as a stamp method, may be used.

[3-4. Dam Formation Process]

Figure 8:
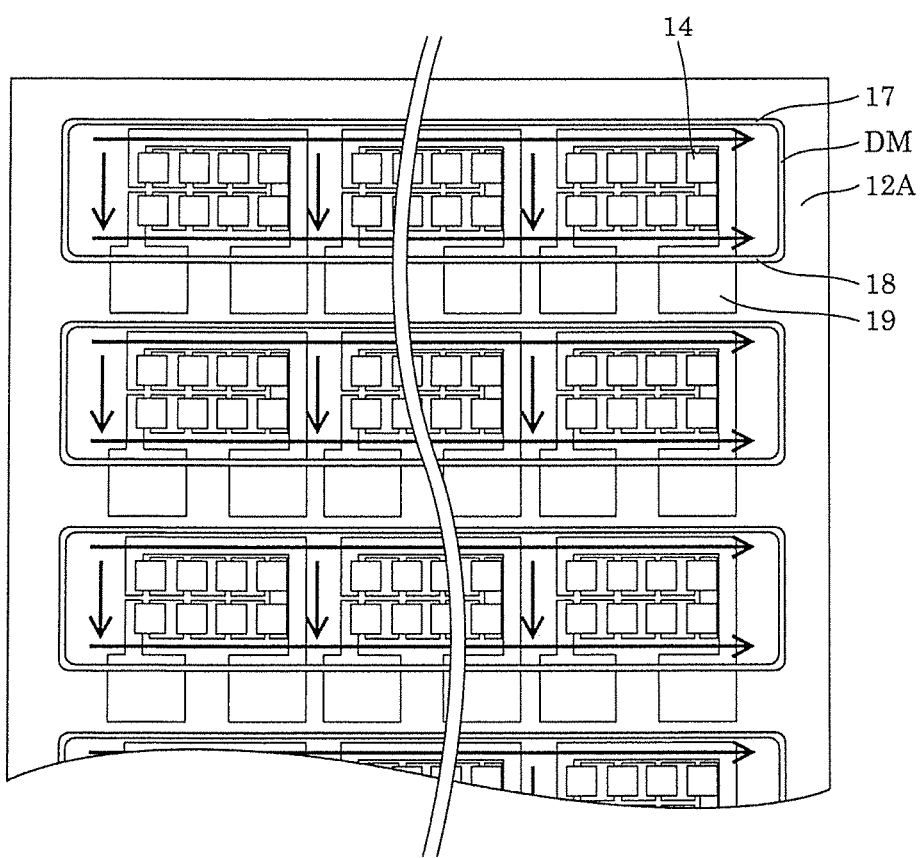
FIG. 8 is a plan view of the aggregate substrate showing a dam formation process according to the embodiment.

Next, a dam formation process will be described with reference to the drawings. FIG. 8 is a plan view of aggregate substrate 12A showing a dam formation process according to the present embodiment. FIG. 9 is a cross-sectional view of aggregate substrate 12A, first dam 17, second dam 18 and the like showing the dam formation process according to the present embodiment. FIG. 9 illustrates a cross section similar to the cross section illustrated in FIG. 5B.

As illustrated in FIG. 8, a plurality of closed curve (ring shaped) dams DM are formed on aggregate substrate 12A. In the formation of dam DM, first, aggregate substrate 12A is heated, and a paste-like dam-forming material is applied in a thin linear shape at predetermined positions on aggregate substrate 12A which has reached a predetermined temperature. Specifically, as illustrated in FIG. 8, on aggregate substrate 12A, a dam forming material is applied along the dividing lines (not illustrated) of aggregate substrate 12A in a closed curve shape for each row of light source devices, that is, every eight light-emitting unit matrix, so as to surround the light-emitting unit matrix arrangement region.

The closed curve dam DM is divided later when aggregate substrate 12A is cut into pieces, and becomes two linear dams of first dam 17 which is disposed at an end portion of light source device 11 and second dam 18 which is disposed at the central portion of light source device 11 and which is parallel to first dam 17. Light-emitting unit matrix 20 is disposed between first dam 17 and second dam 18.

In the present embodiment, a silicone resin, in which titanium oxide ($TiO_2$) and silicon dioxide which are light reflective materials are dispersed, is used as the dam forming material. Here, a high height is required as a structural requirement of the dam. The viscosity of the dam forming material is preferably high in order to form a thin line having a high height. However, in the dispensing method, if the viscosity is too high, discharging of the dam forming material from the nozzle becomes difficult. Therefore, the viscosity of the dam forming material is set, for example, to such a degree that the shape does not collapse too much after application, such as toothpaste paste. In the present embodiment, the dam forming material is applied linearly in a width of about 200 μm to finally form dam DM having a width of about 200 μm and a height of about 180 μm.

[3-5. Reflective Resin Formation Process]

Next, the reflective resin forming material is filled on aggregate substrate 12A, and in a region including the light-emitting unit matrix arrangement region surrounded by the closed curve dam, so that reflective resin 16 is formed between the light-emitting units and between light-emitting elements 13 and aggregate substrate 12A.

In the present embodiment, a silicone resin, in which titanium oxide ($TiO_2$) of light reflective particles is dispersed, is used as the reflective resin forming material. A low-viscosity silicone resin may be used in order to spread the reflective resin to the regions to which the reflective resin is not applied directly, such as the region between the light-emitting units and the region between light-emitting elements 13 and aggregate substrate 12A. However, if the viscosity is too low, dripping from the nozzle occurs at the time of application. Hence, a silicone resin with a viscosity appropriately low to the extent that dripping is less likely to occur, and where the reflective resin forming material can be sufficiently spread between the light-emitting units by surface tension, is used.

The reflective resin forming material is not limited to silicone resin, but may be resin such as epoxy resin, acrylic resin, polyimide resin, urea resin, or fluorine resin, or a material which mainly includes glass and in which light reflective particles are dispersed in a low viscosity liquid transparent medium. For example, particles of titanium oxide, alumina or zinc oxide may be used as the light reflective particles. Reflective resin 16 can be formed by curing a liquid resin containing a light reflective material. By containing powdery titanium oxide and a dispersing agent in liquid resin or glass and curing them, it is possible to obtain a reflective resin having a reflection function while maintaining insulating properties.

After the formation of dam DM, a reflective resin forming material is applied to the outside the light-emitting unit matrix arrangement region by a dispensing method. Specifically, as illustrated in FIG. 8, on aggregate substrate 12A before being cut into individual pieces, a reflective resin forming material is linearly applied in the gap between the outer peripheral line of each light-emitting unit matrix 20 and dam DM and the gap between adjacent light-emitting unit matrixes 20 along the four sides of the outer peripheral line of each light-emitting unit matrix 20 in the arrow directions.

The reflective resin forming material spreads over the entire region inside dam DM, and also fills the space between the light-emitting units and between light-emitting elements 13 and aggregate substrate 12A. At this time, although the side surfaces of light transmissive member 14 are covered with the reflective resin forming material, the upper surface of light transmissive member 14 is exposed from the reflective resin forming material.

The reflective resin forming material that has spread inside the outer peripheral line of light-emitting unit matrix 20 exposes the entire upper surface of light transmissive member 14. However, the reflective resin forming material between the adjacent light-emitting units protrudes beyond the upper surface of light transmissive member 14 due to the upward capillary action (direction away from aggregate substrate 12A). The application amount of the reflective resin forming material is determined such that, as illustrated in FIG. 2A, the upper surface of the reflective resin forming material inside the outer peripheral line of light-emitting unit matrix 20 protrudes beyond the upper surface of the light transmissive member, and the upper surface of the reflective resin forming material outside the outer peripheral line of light-emitting unit matrix 20 is recessed relative to the upper surface of light transmissive member 14.

In the present embodiment, in order to make reflective resin 16 between the light-emitting units inside the outer peripheral line of light-emitting unit matrix 20 locally project, the drawing up of the reflective resin forming material by capillary action is used. In the present embodiment, the gap between adjacent light-emitting units is set to 100 μm in the row direction and 50 μm in the column direction, but, for example, the gap may be less than or equal to about 200 μm. If the gap is less than or equal to about 200 μm, capillary action occurs, so that the shape of reflective resin 16 according to the present embodiment, that is, the shape in which reflective resin 16 protrudes beyond the upper surface of each light-emitting unit between the light-emitting units can be realized. In addition, the gap may be less than or equal to about 100 μm. Accordingly, the shape in which reflective resin 16 between the light-emitting units protrudes beyond the upper surface of each light-emitting unit can be realized more reliably.

After the application of the reflective resin forming material is completed, aggregate substrate 12A is heated in an oven to cure the reflective resin forming material. In the present embodiment, curing of the reflective resin forming material is performed at 150 degrees Celsius for one hour. In this way, reflective resin 16 is formed.

Next, aggregate substrate 12A is cut into sixty four substrates 12, so that light source devices 11 are formed. In cutting of aggregate substrate 12A into individual pieces, for example, dicing can be used.

[4. Shape of Reflective Resin]

Next, the shape of reflective resin 16 in light source device 11 formed by the above described manufacturing method will be described.

As illustrated in FIG. 2A, reflective resin 16 is formed in a region on substrate 12 on which light-emitting elements 13 are mounted, and covers the region so as to surround the bottom surface (the surface opposite substrate 12) and the side surfaces of light-emitting element 13, transparent resin 15, and light transmissive member 14.

Here, the protrusion height of reflective resin 16 formed by the above described manufacturing method will be described with reference to the drawings. FIG. 10A is a plan view showing measurement points of the height of reflective resin 16. FIG. 10B is a table showing the protrusion height of reflective resin 16 at each measurement position.

As illustrated in FIG. 10A, the height of reflective resin 16 was measured at total thirty-one points including three intersection points of first reflective portion 16a with second reflective portion 16b, third reflective portion 16c, and fourth reflective portion 16d, eight intersection points between each reflective portion and the outer edge (outer peripheral line) of light-emitting unit matrix 20, ten center points between each intersection, and ten points at positions 50 μm away from the outer edge of light-emitting unit matrix 20 toward the outside.

The height of the top of the protruding portion of reflective resin 16 at the measurement point relative to the upper surface of the light-emitting unit adjacent to the measurement point (the upper surface of the light transmissive member in the present embodiment) was defined as the protrusion height.

Figure 11:
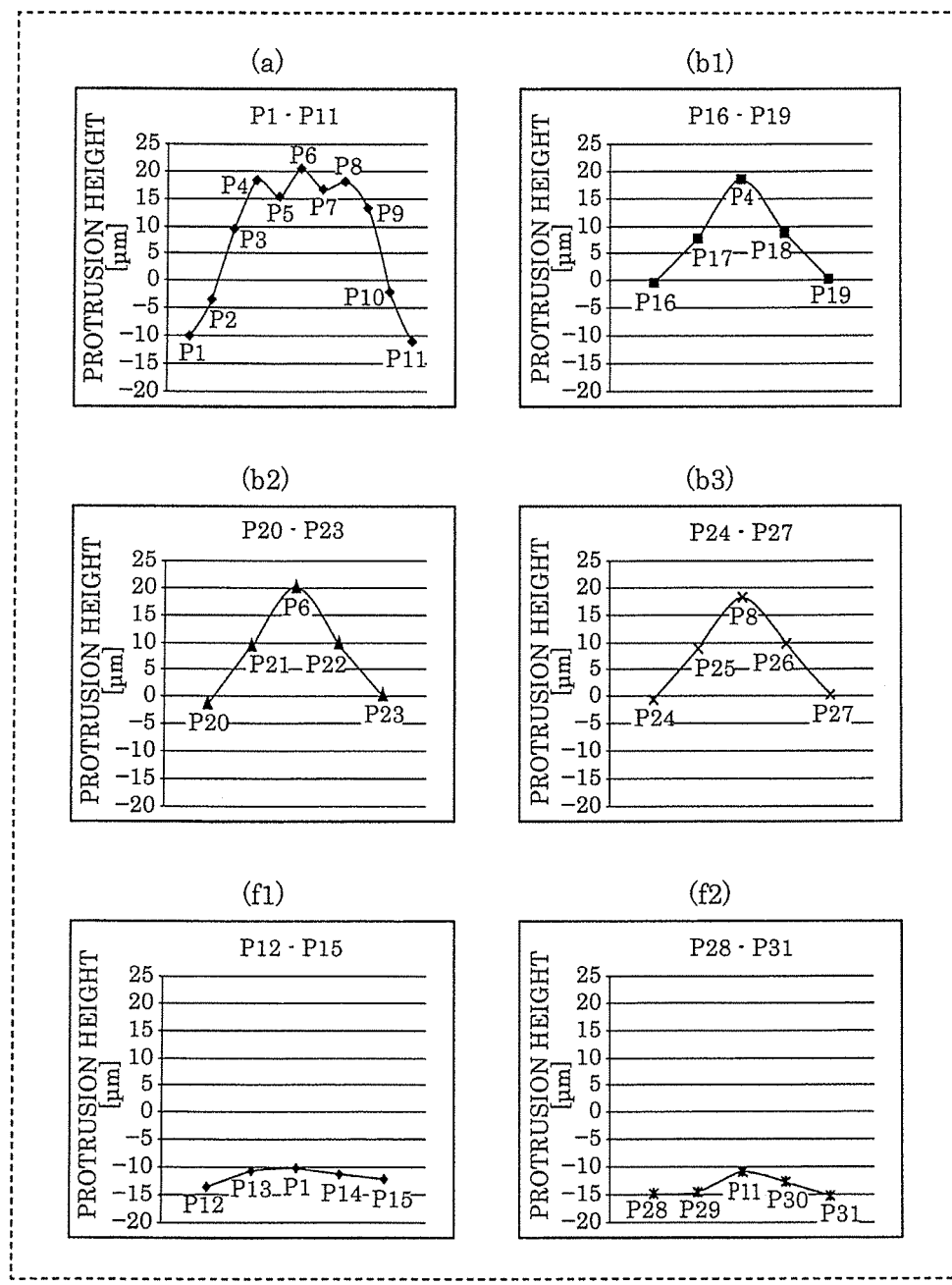
FIG. 11 shows graphs each of which indicates a relationship between the reflective resin and the measurement values of the protrusion height at each measurement position shown in FIG. 10B.

As illustrated in FIG. 10B, the relationship between the measurement positions (P1 to P31) of the protrusion height of reflective resin 16 and the measurement value of the protrusion height was obtained. Hereinafter, the relationship illustrated in FIG. 10B will be described graphically. FIG. 11 illustrates graphs each showing the relationship between reflective resin 16 and the measurement value of the protrusion height at each measurement position illustrated in FIG. 10B.

Graph (a) of FIG. 11 shows the protrusion height of reflective resin 16 at nine measurement points (P2 to P10) of first reflective portion 16a and two outside points (P1 and P11) in the extending direction of first reflective portion 16a. As shown in graph (a) of FIG. 11, the protrusion height is 9.2 μm to 20.4 μm at seven points (P3 to P9) excluding both ends of first reflective portion 16a, and the upper surface of reflective resin 16 is higher than the upper surface of each light-emitting unit. Moreover, the protrusion height at measurement points P4, P6, and P8 corresponding to first intersection 16e, second intersection 16f, and third intersection 16g is higher than the protrusion height at other measurement points by about 4 μm to 9 μm. Furthermore, the protrusion height at measurement point P6 positioned at the center of light-emitting unit matrix 20 is higher than the protrusion height at measurement points P4 and P8 corresponding to other intersections by about 2 μm. The protrusion height at two points (P2, P10) at both ends of first reflective portion 16a and two outside points (P1, P11) is −11.1 μm to −2.0 μm, and the upper surface of reflective resin 16 is lower than the upper surface of each light-emitting unit. The protrusion height gradually decreases from measurement point P4 corresponding to first intersection 16e which is one of the intersections closest to the outer edge of light-emitting unit matrix 20 toward P1 which is outside the outer edge. In addition, the protrusion height gradually decreases from measurement point P8 corresponding to third intersection 16g which is another one of the intersections closest to the outer edge of light-emitting unit matrix 20 toward P11 which is outside the outer edge. In other words, from measurement points P4 to P1 and from measurement points P8 to P11, the upper surface of reflective resin 16 approaches substrate 12, and is recessed relative to the upper surface of each light-emitting unit in a region from the vicinity of the outer edge of light-emitting unit matrix 20 to the outside light-emitting unit matrix 20.

In FIG. 11, graphs (b1), (b2), and (b3) show the protrusion height of reflective resin 16 at the measurement points (P4, P16 to P19) of second reflective portion 16b, the measurement points (P6, P20 to P23) of third reflective portion 16c, and the measurement points (P8, P24 to P27) of fourth reflective portion 16d, respectively.

As shown in graphs (b1), (b2) and (b3) of FIG. 11, the protrusion height of all of second reflective portion 16b, third reflective portion 16c, and fourth reflective portion 16d at the three measurement points excluding the measurement points at both ends are 7.5 µm to 20.4 µm, and the upper surface of reflective resin 16 is higher than the upper surface of each light-emitting unit. The protrusion height at measurement points P4, P6 and P8 respectively corresponding to first intersection 16e, second intersection 16f, and third intersection 16g is higher than the protrusion height at other measurement points by about 10 µm. The protrusion height at the measurement points at both ends of each reflective portion is −1.1 µm to 0.5 µm, and the upper surface of reflective resin 16 is approximately the same as or slightly lower than the upper surface of each light-emitting unit. The protrusion height gradually decreases from measurement point P4 corresponding to first intersection 16e toward outside measurement points P16 and P19. In a similar manner, the protrusion height gradually decreases from measurement point P6 corresponding to second intersection 16f toward measurement points P20 and P23, and from measurement point P8 corresponding to third intersection 16g toward measurement points P24 and P27.

Graphs (f1) and (f2) of FIG. 11 show the protrusion height of reflective resin 16 at measurement points (P1, P11 to P15, P28 to P31) outside the outer peripheral line of light-emitting unit matrix 20. The protrusion height at any of these measurement points is −15.1 µm to −10.2 µm, and the upper surface of reflective resin 16 is lower than the upper surface of each light-emitting unit. Although the protrusion height at measurement points P1 and P11 along the extension of first reflective portion 16a is higher than the height at other measurement points, the upper surface of reflective resin 16 is not higher than the upper surface of each light-emitting unit.

Here, since capillary action depends on the tube diameter, light source device 11 was created by changing distance D1 between the top portions of the adjacent light-emitting units, that is, the gap between the adjacent light-emitting units in a plan view of substrate 12. After that, the protrusion height was measured in the same manner.

Figure 12:
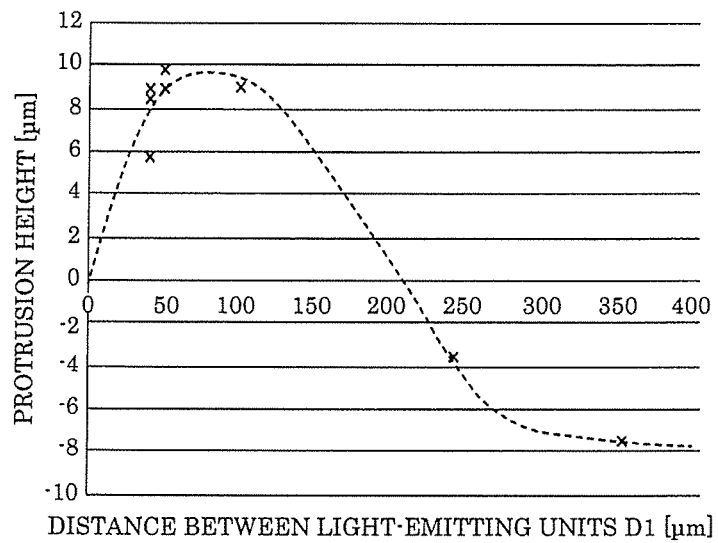
FIG. 12 is a graph showing a relationship between distance D1 between the top portions of adjacent light-emitting units in a light-emitting unit matrix and the protrusion height of the reflective resin from the light transmissive member.

FIG. 12 is a graph showing a relationship between distance D1, which is between the top portions of adjacent light-emitting units in light-emitting unit matrix 20 (the distance between adjacent light transmissive members 14 in the present embodiment), and the protrusion height of reflective resin 16 from the upper surface of each light-emitting unit (the upper surface of light transmissive member 14 in the present embodiment). As shown in FIG. 12, when distance D1 between adjacent light-emitting units is greater than or equal to about 100 µm, the protrusion height of reflective resin 16 is in a substantially inverse proportion to distance D1. By setting distance D1 to less than or equal to about 200 µm, it was possible to make reflective resin 16 protrude beyond the upper surface of each light-emitting unit. The protrusion height was the highest when distance D1 was 100 µm. Therefore, in light source device 11 according to the present embodiment, for example, the gap between first light-emitting unit 20a and second light-emitting unit 20b may be less than or equal to 200 µm in a plan view of substrate 12. In addition, the gap may be less than or equal to about 100 µm.

As described above, by reducing distance D1 between the adjacent light-emitting units, it is possible to draw the reflective resin forming material up into the gap between the adjacent light-emitting units by capillary action, and form reflective resin 16 having a protruding shape. The reflective resin drawn up higher than the upper surface of light transmissive member 14 can maintain the protruding shape by surface tension.

[5. Light Projecting Device]

Figure 13:
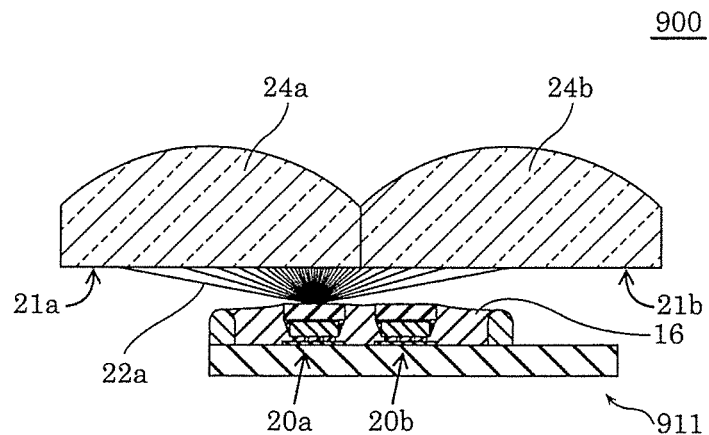
FIG. 13 schematically illustrates a cross-section of a light projecting device including a light source device according to a comparative example.

Next, a light projecting device including light source device 11 according to the present embodiment will be described with reference to the drawings and in comparison with a comparative example. FIG. 13 schematically illustrates a cross-section of light projecting device 900 including light source device 911 according to the comparative example. Light projecting device 900 according to the comparative example includes: light source device 911 including first light-emitting unit 20a and second light-emitting unit 20b; first lens 24a which controls the light distribution of first light-emitting unit 20a; and second lens 24b which controls the light distribution of second light-emitting unit 20b. First light-emitting unit 20a and second light-emitting unit 20b included in light source device 911 according to the comparative example have the same configuration as first light-emitting unit 20a and second light-emitting unit 20b according to the present embodiment. Light source device 911 according to the comparative example is different from light source device 11 according to the present embodiment in that reflective resin 16 disposed between first light-emitting unit 20a and second light-emitting unit 20b is recessed relative to the upper surface of each light-emitting unit.

Figure 14:
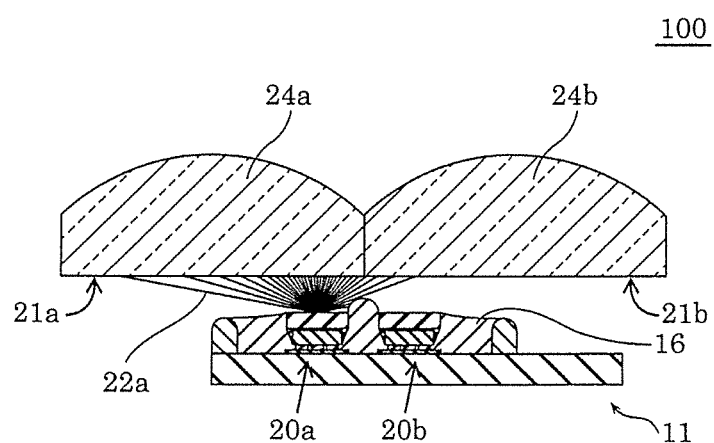
FIG. 14 schematically illustrates a cross-section of a configuration of a light projecting device including the light source device according to the embodiment.

FIG. 14 schematically illustrates a cross-section of a configuration of light projecting device 100 including light source device 11 according to the present embodiment. In light source device 11 according to the present embodiment, as described above, the upper surface of reflective resin 16 between adjacent light-emitting units protrudes beyond the upper surface of each light-emitting unit. As illustrated in FIG. 14, light projecting device 100 includes light source device 11 and lenses corresponding to a plurality of light-emitting units included in light source device 11. In FIG. 14, only first light-emitting unit 20a and second light-emitting unit 20b are illustrated among the plurality of light-emitting units of light source device 11, and only first lens 24a and second lens 24b respectively corresponding to first light-emitting unit 20a and second light-emitting unit 20b are illustrated among the lenses.

In light projecting device 900 illustrated in FIG. 13, light 22a emitted from first light-emitting unit 20a enters light receiving surface 21a of first lens 24a and also enters light receiving surface 21b of adjacent second lens 24b. In contrast, in light projecting device 100 illustrated in FIG. 14, since the protrusion of reflective resin 16 exists between the light-emitting units, at least part of light 22a emitted from first light-emitting unit 20a and traveling toward second lens 24b side is blocked and reflected toward first lens 24a side by the protrusion of reflective resin 16. For this reason, the light emitted from first light-emitting unit 20a and entering light-receiving surface 21b of adjacent second lens 24b can be reduced. Therefore, in light projecting device 100 according to the present embodiment, the optical sharp edge of each light-emitting unit can be improved.

The optical sharp edge of light source device 11 described above is a useful technique particularly in a light projecting device which radiates the light distribution pattern of the light source device forward through a mirror array and a lens, such as a DMD type light projecting device in a matrix beam headlamp of an automobile.

In the DMD method used for a matrix beam headlamp of an automobile, illuminated portions and non-illuminated portions of the pattern radiated forward are controlled in order to reduce glare and the like for oncoming vehicles and pedestrians on the road. As a method for controlling the pattern to be radiated forward, first, light-emitting units necessary for drawing the forward radiation pattern are individually turned on, and light from each light-emitting unit is condensed on the mirror array by a condensing lens group formed for each light-emitting unit. The radiation pattern in a fine pixel unit which cannot be sufficiently controlled only by individually turning on and off the light-emitting units is adjusted by controlling the angle of the mirror arranged in the region where light was emitted in the mirror array. In other words, the mirror controls the light reflecting direction and controls the illuminated regions and the non-illuminated regions in front. Here, if the light distribution pattern of each light-emitting unit has a sharper edge, the light distribution pattern condensed on the mirror array becomes clearer. This allows the pixel miniaturization of the mirror array, leading to a clearer light distribution pattern of the forward radiation.

Here, it is not impossible to realize a clear light distribution pattern by using only a mirror array. In other words, it is also possible to form a light distribution pattern by emitting light to a wide region from the light-emitting unit and discarding the light in the non-illuminated region by the mirror array. However, even if the light in the non-illuminated region is discarded by the mirror array, the light-emitting unit which has emitted the discarded light is kept on. Hence, the light-emitting unit generates heat, leading to a reduced light emission efficiency of the light source device. Therefore, in order to improve the light emission efficiency of the light source device, first, light distribution pattern control may be performed by individually turning on and off the light-emitting units before the radiation pattern control by the mirror array. In order to precisely control the light distribution pattern by individually turning on and off the light-emitting units, an optical sharp edge for each light-emitting unit is required. Hereinafter, an example of a DMD type light projecting device using light source device 11 capable of realizing an optical sharp edge will be described with reference to the drawings.

Figure 15:
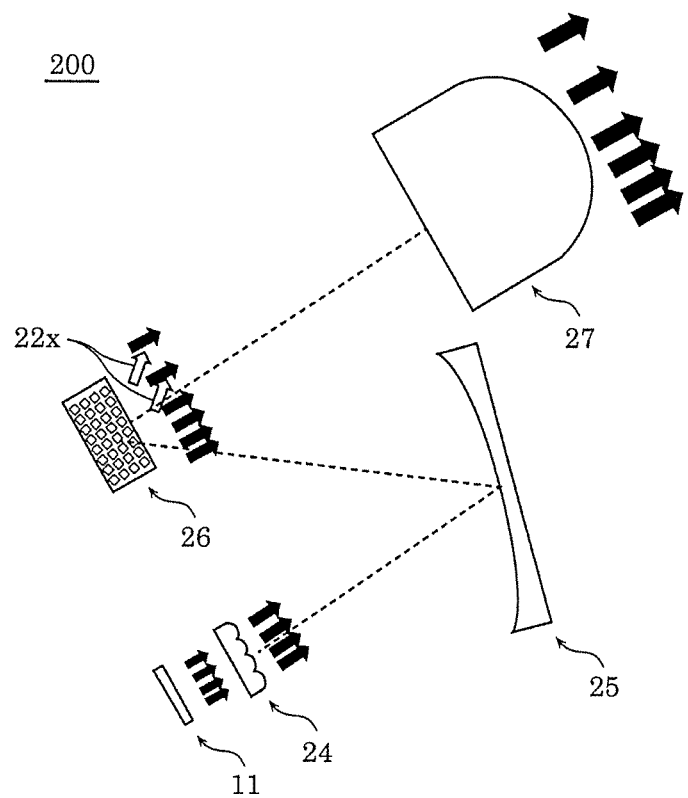
FIG. 15 is a schematic view of a configuration of a DMD type light projecting device including the light source device according to the embodiment.

FIG. 15 schematically illustrates a configuration of DMD type light projecting device 200 including light source device 11 according to the present embodiment. As illustrated in FIG. 15, light projecting device 200 includes light source device 11, mirror array 26 corresponding to light-emitting unit matrix 20, lens 24 for condensing light emitted from light source device 11 on mirror array 26, and light projecting lens 27 for projecting the radiation pattern formed by mirror array 26. In the example illustrated in FIG. 15, light projecting device 200 further includes mirror 25 that reflects, toward mirror array 26, the light condensed by lens 24. By controlling light source device 11 and mirror array 26, light projecting device 200 is capable of projecting a desired radiation pattern onto an object to be radiated such as a road surface.

Lens 24 is a condensing lens group disposed in front of light source device 11, and includes a plurality of condensing lenses disposed at positions corresponding to the plurality of light-emitting units of light source device 11.

Mirror array 26 is an optical device which is disposed on the optical path of the light condensed by lens 24 and in which a plurality of minute mirrors are arrayed.

Each mirror of mirror array 26 is configured to be able to control the angle with respect to the incident light, and a portion of the light incident on mirror array 26 from light source device 11 through lens 24 is reflected in the optical axis direction of the lamp. However, light 22x reflected by the mirror whose angle has been changed is reflected in the direction deviated from the optical axis. The light reflected in the direction of the optical axis is indicated by black arrows between mirror array 26 and light projecting lens 27, and light 22x reflected in the direction deviated from the optical axis is indicated by, for example, open arrows in the upper right of mirror array 26. Since the light deviated from the optical axis does not pass through light projecting lens 27, the radiation pattern in the optical axis direction formed by mirror array 26 can be projected by light projecting lens 27. Accordingly, radiation with the radiation pattern as indicated by black arrows which have passed through light projecting lens 27 illustrated in FIG. 15 is realized.

Moreover, with use of light source device 11, light projecting device 200 according to the present embodiment is capable of making the optical sharp edge of the light distribution pattern clear particularly in the region corresponding to the boundary portion of the light-emitting units. Therefore, light projecting device 200 according to the present embodiment is capable of realizing a clear radiation pattern.

(Modification Etc.)

Although light source device 11 and light projecting devices 100 and 200 according to the present disclosure have been described based on the embodiment above, the present disclosure is not limited to the embodiment.

For example, in the above embodiment, light source device 11 includes eight light-emitting units, but the number of light-emitting units does not have to be eight. The number of light-emitting units may be at least four.

Forms obtained by various modifications to the above embodiment that can be conceived by a person of skill in the art as well as forms realized by arbitrarily combining structural elements and functions in the above embodiment which are within the scope of the essence of the present disclosure are included in the present disclosure.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The light source device and the light projecting device according to the present disclosure are particularly useful in, for example, a matrix beam headlamp of an automobile which is required to have an optical sharp edge.

What is claimed is:

1. A light source device, comprising:
a substrate;
a light-emitting unit matrix including a plurality of light-emitting units disposed in a matrix on the substrate; and
a reflective resin disposed in a region on the substrate, the region including a region where the light-emitting unit matrix is disposed,
wherein the plurality of light-emitting units include a first light-emitting unit and a second light-emitting unit adjacent to each other in a column direction of the light-emitting unit matrix,
the reflective resin includes a first reflective portion disposed between the first light-emitting unit and the second light-emitting unit, and extending in a direction intersecting the column direction,
at least a portion of an upper surface of the first reflective portion protrudes beyond an upper surface of the first light-emitting unit and an upper surface of the second light-emitting unit,
the plurality of light-emitting units include a third light-emitting unit and a fourth light-emitting unit adjacent to each other in the column direction,
the first light-emitting unit, the second light-emitting unit, the third light-emitting unit, and the fourth light-emitting unit are arranged in a matrix of two rows and two columns,
the third light-emitting unit is adjacent to the first light-emitting unit,
the fourth light-emitting unit is adjacent to the second light-emitting unit,
the reflective resin includes a second reflective portion disposed between the first light-emitting unit and the third light-emitting unit and extending in the column direction, and
an upper surface of a first intersection where the first reflective portion intersects the second reflective portion protrudes beyond an upper surface of a portion of the first reflective portion between the first light-emitting unit and the second light-emitting unit and an upper surface of a portion of the second reflective portion between the first light-emitting unit and the third light-emitting unit.

2. The light source device according to claim 1,
wherein, in a plan view of the substrate, the first light-emitting unit and the second light-emitting unit are arranged adjacent to one of outer edges of the light-emitting unit matrix extending in the column direction of the light-emitting unit matrix, and
an upper surface of the first reflective portion approaches the substrate as the first reflective portion approaches the one of the outer edges from the first intersection.

3. The light source device according to claim 1,
wherein the plurality of light-emitting units include a fifth light-emitting unit and a sixth light-emitting unit adjacent to each other in the column direction,
the first light-emitting unit, the second light-emitting unit, the third light-emitting unit, the fourth light-emitting unit, the fifth light-emitting unit, and the sixth light-emitting unit are arranged in a matrix of two rows and three columns,
the fifth light-emitting unit is adjacent to the third light-emitting unit,
the sixth light-emitting unit is adjacent to the fourth light-emitting unit,
the reflective resin includes a third reflective portion disposed between the third light-emitting unit and the fifth light-emitting unit and extending in the column direction, and
the upper surface of the first intersection and an upper surface of a second intersection where the first reflective portion intersects the third reflective portion protrude beyond an upper surface of a portion of the first reflective portion between the first intersection and the second intersection.

4. The light source device according to claim 1,
wherein, in a plan view of the substrate, in an outer edge portion where the first reflective portion intersects an outer edge of the light-emitting unit matrix, the upper surface of the reflective resin is recessed relative to the upper surface of the first light-emitting unit and the upper surface of the second light-emitting unit.

5. The light source device according to claim 1,
wherein an upper surface of the reflective resin outside the light-emitting unit matrix is recessed relative to the upper surface of the first light-emitting unit and the upper surface of the second light-emitting unit.

6. The light source device according to claim 1,
wherein, in a plan view of the substrate, a gap between the first light-emitting unit and the second light-emitting unit is less than or equal to 200 μm.

7. The light source device according to claim 1,
wherein each of the first light-emitting unit and the second light-emitting unit includes a light-emitting element bonded to the substrate, and a light transmissive member disposed on a first surface of the light-emitting element opposite a second surface of the light-emitting element, the second surface being adjacent to the substrate.

8. A light projecting device, comprising:
the light source device according to claim 1; and
a lens group including lenses corresponding to the plurality of light-emitting units.

9. A light projecting device, comprising:
the light source device according to claim 1;
a mirror array corresponding to the light-emitting unit matrix;
a lens which condenses, on the mirror array, light emitted from the light source device; and
a light projecting lens which projects a radiation pattern formed by the mirror array.

* * * * *